(12) United States Patent
Jeong et al.

(10) Patent No.: US 7,164,598 B2
(45) Date of Patent: Jan. 16, 2007

(54) METHODS OF OPERATING MAGNETIC RANDOM ACCESS MEMORY DEVICE USING SPIN INJECTION AND RELATED DEVICES

(75) Inventors: Won-Cheol Jeong, Seoul (KR); Ki-Nam Kim, Gyeonggi-do (KR); Hong-Sik Jeong, Gyeonggi-do (KR); Gi-Tae Jeong, Seoul (KR); Jae-Hyun Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 19 days.

(21) Appl. No.: 11/201,495

(22) Filed: Aug. 11, 2005

(65) Prior Publication Data

US 2006/0034117 A1 Feb. 16, 2006

(30) Foreign Application Priority Data

Aug. 12, 2004 (KR) .................. 10-2004-0063641

(51) Int. Cl.
*G11C 11/00* (2006.01)
*G11C 11/15* (2006.01)
(52) U.S. Cl. .................. 365/158; 365/171; 365/173
(58) Field of Classification Search ............... 365/158, 365/171, 173
See application file for complete search history.

(56) References Cited

U.S. PATENT DOCUMENTS 6,130,814 A 10/2000 Sun
6,163,477 A 12/2000 Tran
6,385,082 B1 5/2002 Abraham et al.
6,385,083 B1 5/2002 Sharma et al.
6,430,085 B1 8/2002 Rizzo
6,509,621 B1 1/2003 Nakao (Continued)

FOREIGN PATENT DOCUMENTS

JP 2001-084757 3/2001

(Continued)

OTHER PUBLICATIONS

Boeck et al. "Spintronics, a New Nanoelectronics Adventure" *thinfilmmfg.com* 5 pages (2002) <http://www.thinfilmmfg.com/subscribers/Subscriber02/spin1May02.htm> Accessed online on May 20, 2005.

(Continued)

*Primary Examiner*—Trong Phan
(74) *Attorney, Agent, or Firm*—Myers Bigel Sibley & Sajovec

(57) ABSTRACT

Methods are provided for operating a magnetic random access memory device including a memory cell having a magnetic tunnel junction structure on a substrate. In particular, a writing current pulse may be provided through the magnetic tunnel junction structure, and a writing magnetic field pulse may be provided through the magnetic tunnel junction structure. In addition, at least a portion of the writing magnetic field pulse may be overlapping in time with respect to at least a portion of the writing current pulse, and at least a portion of the writing current pulse and/or at least a portion of the writing magnetic field pulse may be non-overlapping in time with respect to the other. Related devices are also discussed.

42 Claims, 10 Drawing Sheets

U.S. PATENT DOCUMENTS

| | | | |
|---|---|---|---|
| 6,545,906 B1 | 4/2003 | Savtchenko al. | |
| 6,560,135 B1 | 5/2003 | Matsuoka et al. | |
| 6,603,677 B1 | 8/2003 | Redon et al. | |
| 6,603,678 B1 | 8/2003 | Nickel et al. | |
| 6,720,597 B1 | 4/2004 | Janesky et al. | |
| 6,724,651 B1 * | 4/2004 | Hirai | 365/158 |
| 6,724,674 B1 | 4/2004 | Abraham et al. | |
| 6,744,651 B1 | 6/2004 | Tang | |
| 6,762,953 B1 | 7/2004 | Tanizaki et al. | |
| 6,771,534 B1 | 8/2004 | Stipe | |
| 6,791,874 B1 | 9/2004 | Tran et al. | |
| 6,794,696 B1 | 9/2004 | Fukuzumi | |
| 6,870,757 B1 * | 3/2005 | Hidaka | 365/158 |
| 6,894,919 B1 * | 5/2005 | Fukuzumi | 365/158 |
| 6,898,113 B1 * | 5/2005 | Tsuji | 365/158 |
| 6,992,935 B1 * | 1/2006 | Ooishi | 365/158 |
| 2002/0176277 A1 | 11/2002 | Bessho et al. | |
| 2003/0170976 A1 | 9/2003 | Molla et al. | |
| 2005/0078510 A1 | 4/2005 | Jeong et al. | |

FOREIGN PATENT DOCUMENTS

| | | |
|---|---|---|
| JP | 2001/084758 | 3/2001 |
| JP | 2001-250206 | 9/2001 |
| JP | 2002-319664 | 10/2002 |
| JP | 2004/087519 | 3/2004 |
| KR | 1020020046036 | 6/2002 |
| KR | 1020030040027 | 5/2003 |
| KR | 1020040003479 | 1/2004 |
| KR | 1020040026619 | 3/2004 |
| KR | 1020040038420 | 5/2004 |
| WO | WO 2004/049344 | 6/2004 |

OTHER PUBLICATIONS

Deak "Spin Injection in Thermally Assisted Magnetic Random Access Memory" 15 pages <http://www.nve.com/advpdf/49th_MMM_spin_injection_TA_MRAM.pdf> Accessed online on Jun. 20, 2005.

Fert et al. "The New Era of Spintronics" *Europhysics News* 34(6) 7 pages (2003) <http://www.europhysicsnews.com/full/24/article9/article9.html> Accessed online on Jun. 20, 2005.

Johnson "Magnetic Spin Locks data into MRAMS" *EETimes Online* (Jul. 17, 2001) 4 pages <http://www.eetimes.com/story/OEG20010717S0064> Accessed online on Apr. 18, 2005.

* cited by examiner

METHODS OF OPERATING MAGNETIC RANDOM ACCESS MEMORY DEVICE USING SPIN INJECTION AND RELATED DEVICES

RELATED APPLICATION

This application claims the benefit of priority from Korean Patent Application No. 2004-63641, filed Aug. 12, 2004, the disclosure of which is hereby incorporated herein by reference in its entirety.

FIELD OF THE INVENTION

The present invention relates to methods of operating semiconductor memory devices and, more particularly, to methods of operating magnetic random access memory (MRAM) devices using a spin injection mechanism.

BACKGROUND

Magnetic Random Access Memory (MRAM) devices are nonvolatile memory devices which can be operated at relatively low voltages and at relatively high speeds. In a unit memory cell of an MRAM device, data is stored in a magnetic tunnel junction (MTJ) structure of a magnetic resistor. The MTJ structure may include first and second ferromagnetic layers and a tunneling insulation layer therebetween. A magnetic polarization of the first ferromagnetic layer (referred to as a free layer) may be changed using an external magnetic field that crosses the MTJ structure. The external magnetic field may be induced by a current that flows adjacent the MTJ structure, and a magnetic polarization of the free layer may be parallel or anti-parallel with respect to the fixed magnetic polarization of the second ferromagnetic layer (referred to as a pinned layer). Current used to create the external magnetic field may flow through conductive layers such as a digit line and a bit line, disposed adjacent the MTJ structure.

According to spintronics based on quantum mechanics, when magnetic spins in the free layer and the pinned layer are parallel with respect to each other, a tunneling current passing through the MTJ structure may have a relatively high value (i.e., the resistance of the MTJ structure may have a relatively low value). When the magnetic spins in the free layer and the pinned layer are anti-parallel with respect to each other, a tunneling current passing through the MTJ structure may have a relatively low value (i.e., the resistance of the MTJ structure may have a relatively high value). Accordingly, data of an MRAM cell can be determined according to a direction of the magnetic spins in the free layer.

Most MTJ structures have a rectangular shape or an elliptical shape when viewed from direction perpendicular to the substrate. These shapes may be provided because the magnetic spins in the free layer may have a relatively stable state when the magnetic spins in the free layer are parallel to a longitudinal direction of the free layer.

An MRAM device may include a plurality of MTJ structures, and MTJ structures may exhibit non-uniform switching characteristics according to fabrication operations used. External magnetic fields used to store desired data in different MTJ structures may differ. Accordingly, increased non-uniformity of switching characteristics of MTJ structures may result in reduced writing margins for the MRAM device. In particular, when MTJ structures are scaled down for increased integration density, writing margins may also be reduced. In other words, during a writing operation to selectively store a desired data bit in one of the MTJ structures, undesired data may be written in non-selected MTJ structures that share a bit line and/or a digit line electrically connected to the selected MTJ structure. According to conventional writing methods, a write disturbance may thus occur during an operation used to store data in the selected MTJ structure.

Furthermore, a conventional MRAM cell may include a digit line disposed adjacent the MTJ structure as discussed above. In general, the digit line is provided between the MTJ structure and the substrate, and the MTJ structure has a bottom electrode overlapping the digit line. In this case, the bottom electrode may be electrically connected to a drain region of an access transistor provided below the digit line. Thus, the bottom electrode may extend in a horizontal direction to contact a contact plug formed on the drain region. As a result, reductions in a planar area of the MRAM cell may be difficult due to the presence of the digit line.

MRAM devices suitable for application of a spin injection mechanism have been proposed to reduce write disturbance and to increase integration density. For example, MRAM devices suitable for application of a spin injection mechanism are discussed in U.S. Pat. No. 6,130,814 to Sun, entitled "Current-induced magnetic switching device and memory including the same". In addition, other MRAM devices suitable for application of the spin injection mechanism are disclosed in U.S. Pat. No. 6,603,677 B2 to Redon et al., entitled "Three-layered stacked magnetic spin polarization device with memory". The disclosures of U.S. Pat. No. 6,130,814 and U.S. Pat. No. 6,603,677 are hereby incorporated herein in their entirety by reference.

SUMMARY

According to some embodiments of the present invention, methods may be provided for operating a magnetic random access memory device including a memory cell having a magnetic tunnel junction structure on a substrate. More particularly, a writing current pulse may be provided through the magnetic tunnel junction structure, and a writing magnetic field pulse may be provided through the magnetic tunnel junction structure. Moreover, at least a portion of the writing magnetic field pulse may be overlapping in time with respect to at least a portion of the writing current pulse, and at least a portion of the writing current pulse and/or at least a portion of the writing magnetic field pulse may be non-overlapping in time with respect to the other.

An initiating of the writing current pulse may precedes an initiating of the writing magnetic field pulse and/or a terminating of the writing magnetic field pulse may precedes a terminating of the writing current pulse. More particularly, an initiating of the writing current pulse may precede an initiating of the writing magnetic field pulse and a terminating of the writing magnetic field pulse may precede a terminating of the writing current pulse.

The magnetic tunnel junction structure may include a magnetic resistor. Accordingly, the writing current pulse may be provided in a first direction through the magnetic tunnel junction structure to program a relatively high resistance for the magnetic resistor. The writing current pulse may be provided in a second direction through the magnetic tunnel junction structure to program a relatively low resistance for the magnetic resistor.

The memory cell may include a memory cell access transistor coupled between the magnetic tunnel junction structure and a common source line, and the magnetic tunnel junction structure may be coupled between a bit line and the memory cell access transistor. Moreover, providing the writing current pulse may include turning on the memory cell access transistor and providing a voltage difference between the bit line and the common source line. In addition, the magnetic random access memory device may include a magnetic field conductive line separate from the bit line, and providing the writing magnetic field pulse may include providing a magnetic field current pulse through the magnetic field conductive line. The bit line may be between the magnetic field conductive line and the magnetic tunnel junction structure.

Moreover, the magnetic tunnel junction structure may have a length parallel with respect to a surface of the substrate, the magnetic tunnel junction structure may have a width parallel with respect to the surface of the substrate and perpendicular with respect to the length, the length may be greater than the width, and the magnetic field conductive line may be parallel with respect to the length of the magnetic tunnel junction structure. The magnetic field conductive line and the length of the magnetic tunnel junction structure may be parallel with respect to the bit line, or the magnetic field conductive line and the length of the magnetic tunnel junction structure may be perpendicular with respect to the bit line.

The magnetic tunnel junction structure may include a magnetic resistor including a pinned ferromagnetic layer, a free ferromagnetic layer, and a tunnel insulating layer between the pinned and free ferromagnetic layers. Moreover, at least one of the pinned ferromagnetic layer and/or the free ferromagnetic layer may include a synthetic anti-ferromagnetic layer. After providing the writing current pulse and the writing magnetic field pulse, providing a read signal across the magnetic tunnel junction structure, and a program status of the magnetic tunnel junction structure may be determined based on the read signal. Moreover, providing the read signal may include generating a read voltage across the magnetic tunnel junction structure that is less than a write voltage generated across the magnetic tunnel junction structure when providing the writing current pulse.

According to additional embodiments of the present invention, methods may be provided for operating a magnetic random access memory device including a memory cell having a magnetic tunnel junction structure connected between a bit line and a memory cell access transistor on a substrate, and including a magnetic field conductive line adjacent the memory cell and separate from the bit line. A writing current pulse may be provided through the bit line, through the magnetic tunnel junction structure and through the memory cell access transistor, and a magnetic field current pulse may be provided through the magnetic field conductive line. More particularly, the magnetic field current pulse may be provided to generate a writing magnetic field pulse through the magnetic tunnel junction structure, and at least a portion of the magnetic field current pulse may overlap in time with respect to at least a portion of the writing current pulse.

At least a portion of the writing current pulse and/or at least a portion of the magnetic field current pulse may be non-overlapping in time with respect to the other. In addition, an initiating of the writing current pulse may precede an initiating of the magnetic field current pulse and/or a terminating of the magnetic field current pulse may precede a terminating of the writing current pulse. More particularly, an initiating of the writing current pulse may precedes an initiating of the magnetic field current pulse and a terminating of the magnetic field current pulse may precede a terminating of the writing current pulse.

The magnetic tunnel junction structure may include a magnetic resistor. Accordingly, the writing current pulse may be provided in a first direction through the magnetic tunnel junction structure to program a relatively high resistance for the magnetic resistor, and the writing current pulse may be provided in a second direction through the magnetic tunnel junction structure to program a relatively low resistance for the magnetic resistor. The memory cell access transistor may be coupled between the magnetic tunnel junction structure and a common source line, and providing the writing current pulse may include turning on the memory cell access transistor and providing a voltage difference between the bit line and the common source line. In addition, the bit line may be between the magnetic field conductive line and the magnetic tunnel junction structure.

The magnetic tunnel junction structure may have a length parallel with respect to a surface of the substrate, and the magnetic tunnel junction structure may have a width parallel with respect to the surface of the substrate and perpendicular with respect to the length. Moreover, the length may be greater than the width, and the magnetic field conductive line may be parallel with respect to the length of the magnetic tunnel junction structure. The magnetic field conductive line and the length of the magnetic tunnel junction structure may be parallel with respect to the bit line, or the magnetic field conductive line and the length of the magnetic tunnel junction structure may be perpendicular with respect to the bit line.

The magnetic tunnel junction structure may includes a magnetic resistor having a pinned ferromagnetic layer, a free ferromagnetic layer, and a tunnel insulating layer between the pinned and free ferromagnetic layers. Moreover, at least one of the pinned ferromagnetic layer and/or the free ferromagnetic layer may include a synthetic anti-ferromagnetic layer. In addition, a read signal may be provided across the magnetic tunnel junction structure after providing the writing current pulse and the writing magnetic field pulse, and a program status of the magnetic tunnel junction structure may be determined based on the read signal. Moreover, providing the read signal may include generating a read voltage across the magnetic tunnel junction structure that is less than a write voltage generated across the magnetic tunnel junction structure when providing the writing current pulse.

According to still additional embodiments of the present invention, a magnetic random access memory device may include a memory cell access transistor on a substrate, a bit line spaced apart from the substrate, and magnetic tunnel junction structure, a magnetic field conductive line, and a controller. The magnetic tunnel junction structure may be coupled between the bit line and the memory cell access transistor, and the magnetic field conductive line may be provided adjacent the magnetic tunnel junction structure and separate from the bit line.

A controller coupled to the memory cell access transistor, the bit line, and the magnetic field conductive line, wherein the controller is configured to provide a writing current pulse through the bit line, through the magnetic tunnel junction structure and through the memory cell access transistor, and to provide a magnetic field current pulse through the magnetic field conductive line to generate a writing magnetic field pulse through the magnetic tunnel junction structure wherein at least a portion of the magnetic field current pulse is overlapping in time with respect to at least a portion of the writing current pulse.

At least a portion of the writing current pulse and/or at least a portion of the magnetic field current pulse may be non-overlapping in time with respect to the other. The controller is configured to initiate the writing current pulse before initiating the magnetic field current pulse and/or to terminate the magnetic field current pulse before terminating the writing current pulse. More particularly, the controller may be configured to initiate the writing current pulse before initiating the magnetic field current pulse and to terminate the magnetic field current pulse before terminating the writing current pulse.

The magnetic tunnel junction structure may include a magnetic resistor. Accordingly, the controller may be configured to provide the writing current pulse in a first direction through the magnetic tunnel junction structure to program a relatively high resistance for the magnetic resistor, and the controller may be configured to provide the writing current pulse in a second direction through the magnetic tunnel junction structure to program a relatively low resistance for the magnetic resistor. Moreover, the memory cell access transistor may be coupled between the magnetic tunnel junction structure and a common source line, and the controller may be configured to provide the writing current pulse by turning on the memory cell access transistor and providing a voltage difference between the bit line and the common source line. The bit line may be between the magnetic field conductive line and the magnetic tunnel junction structure.

The magnetic tunnel junction structure may have a length parallel with respect to a surface of the substrate, the magnetic tunnel junction structure may have a width parallel with respect to the surface of the substrate and perpendicular with respect to the length, and the length may be greater than the width. In addition, the magnetic field conductive line may be parallel with respect to the length of the magnetic tunnel junction structure. The magnetic field conductive line and the length of the magnetic tunnel junction structure may be parallel with respect to the bit line, and the magnetic field conductive line and the length of the magnetic tunnel junction structure may be perpendicular with respect to the bit line.

The magnetic tunnel junction structure may include a magnetic resistor having a pinned ferromagnetic layer, a free ferromagnetic layer, and a tunnel insulating layer between the pinned and free ferromagnetic layers. Moreover, at least one of the pinned ferromagnetic layer and/or the free ferromagnetic layer may include a synthetic anti-ferromagnetic layer. The controller may also be configured to provide a read signal across the magnetic tunnel junction structure after providing the writing current pulse and the writing magnetic field pulse, and to determine a program status of the magnetic tunnel junction structure based on the read signal. More particularly, providing the read signal may include generating a read voltage across the magnetic tunnel junction structure that is less than a write voltage generated across the magnetic tunnel junction structure when providing the writing current pulse.

According to some embodiments of the present invention, methods of programming and/or reading data to/from an MRAM device having a plurality of MTJ structures on an integrated circuit substrate may be provided. When programming, a main writing current may be provided through one of the MTJ structures. The main writing current may be a positive writing current that flows from a free layer of the selected MTJ structure toward a pinned layer of the selected MTJ structure, or a negative writing current that flows from the pinned layer of the selected MTJ structure toward the free layer of the selected MTJ structure. A hard magnetic field may be applied to the selected MTJ structure while providing the main writing current. As a result, magnetic polarizations in the selected free layer may be arranged parallel or anti-parallel with respect to magnetic polarizations in the selected pinned layer.

In some embodiments of the present invention, providing the main writing current may include turning on a switching device electrically connected to one terminal of the selected MTJ structure, and applying a main writing signal to a bit line electrically connected to the other terminal of the selected MTJ structure. The positive writing current or the negative writing current may flow through the selected MTJ structure and the switching device connected to the selected MTJ structure.

In other embodiments of the present invention, at least one of the free layer and/or the pinned layer may be a synthetic anti-ferromagnetic (SAF) layer including a first ferromagnetic layer, a second ferromagnetic layer and an anti-ferromagnetic coupling spacer layer therebetween.

In still other embodiments of the present invention, the hard magnetic field may be applied by providing an auxiliary writing current through an auxiliary interconnection line adjacent to the selected MTJ structure. The auxiliary interconnection line may be parallel with respect to a longitudinal direction of the selected MTJ structure.

In yet other embodiments of the present invention, programming operations may include selectively applying a word line signal to one of a plurality of parallel word lines provided on an integrated circuit substrate to turn on access MOS transistors connected to the selected word line. A main writing signal may be selectively applied to one of a plurality of bit lines crossing over the word lines while the word line signal is applied. As a result, a main writing current may flow through a MTJ structure electrically connected to the selected bit line and the selected word line. In other words, a main writing current may flow through a selected MTJ structure electrically connected in series between one of the turned-on access MOS transistors and the selected bit line. The main writing current may be a positive writing current that flows from a free layer of the MTJ structure toward a pinned layer of the MTJ structure or a negative writing current that flows from the pinned layer toward the free layer. An auxiliary writing signal may also be applied to a sub bit line adjacent to and parallel with respect to the selected bit line while the main writing signal is applied, thereby generating a hard magnetic field for the MTJ structure. Magnetic polarizations in the selected free layer may be provided parallel or anti-parallel with respect to magnetic polarizations in the selected pinned layer while the positive writing current or the negative writing current flows.

In still other embodiments of the present invention, programming operations may include selectively applying a word line signal to one of a plurality of parallel word lines provided on an integrated circuit substrate to turn on access MOS transistors connected to the selected word line. A main writing signal may be selectively applied to one of a plurality of bit lines crossing over the word lines while the word line signal is applied. As a result, a main writing current may flow through a MTJ structure electrically connected to the selected bit line and the selected word line. In other words, a main writing current may flow through a selected MTJ structure electrically connected in series between one of the turned-on access MOS transistors and the selected bit line.

The main writing current may be a positive writing current that flows from a free layer of the selected MTJ structure toward a pinned layer of the selected MTJ structure or a negative writing current that flows from the selected pinned layer toward the selected free layer. An auxiliary writing signal may be applied to a digit line adjacent to the selected MTJ structure and crossing the selected bit line while the main writing signal is applied, thereby generating a hard magnetic field for the selected MTJ structure. Magnetic polarizations in the selected free layer may be provided parallel or anti-parallel with respect to magnetic polarizations in the selected pinned layer while the positive writing current or the negative writing current flows.

DETAILED DESCRIPTION

Figure 1:
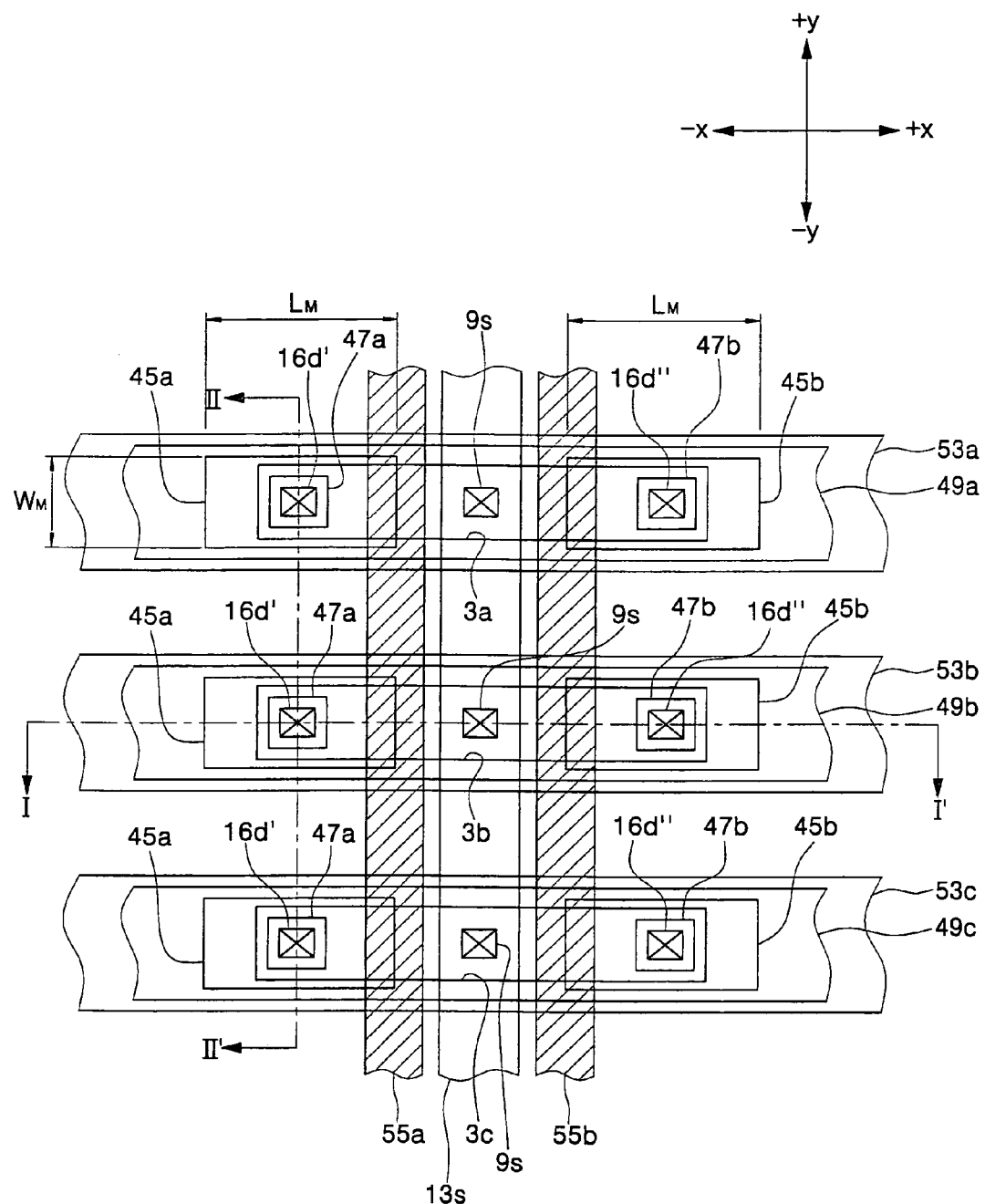
FIG. 1 is a plan view illustrating portions of MRAM devices suitable for programming methods according to first embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, thickness and/or widths of layers, regions, and/or lines are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items.

Embodiments of the invention are described herein with reference to plan and cross-section illustrations that are schematic illustrations of idealized embodiments (and intermediate structures) of the invention. The thickness, lengths, and/or widths of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted regions. Likewise, a buried region formed by implantation may result in some implantation in the region between the buried region and the surface through which the implantation takes place. Moreover, vertically aligned layers may be undercut and/or overcut relative to one another due to variations in etch selectivity when etching multiple self-aligned layers using a single photolighographic or other mask. Thus, the regions illustrated in the figures are schematic in nature and their shapes are not intended to illustrate the actual shape of a region of a device and are not intended to limit the scope of the invention.

Furthermore, relative terms, such as top, bottom, beneath, over, under, upper, and/or lower may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
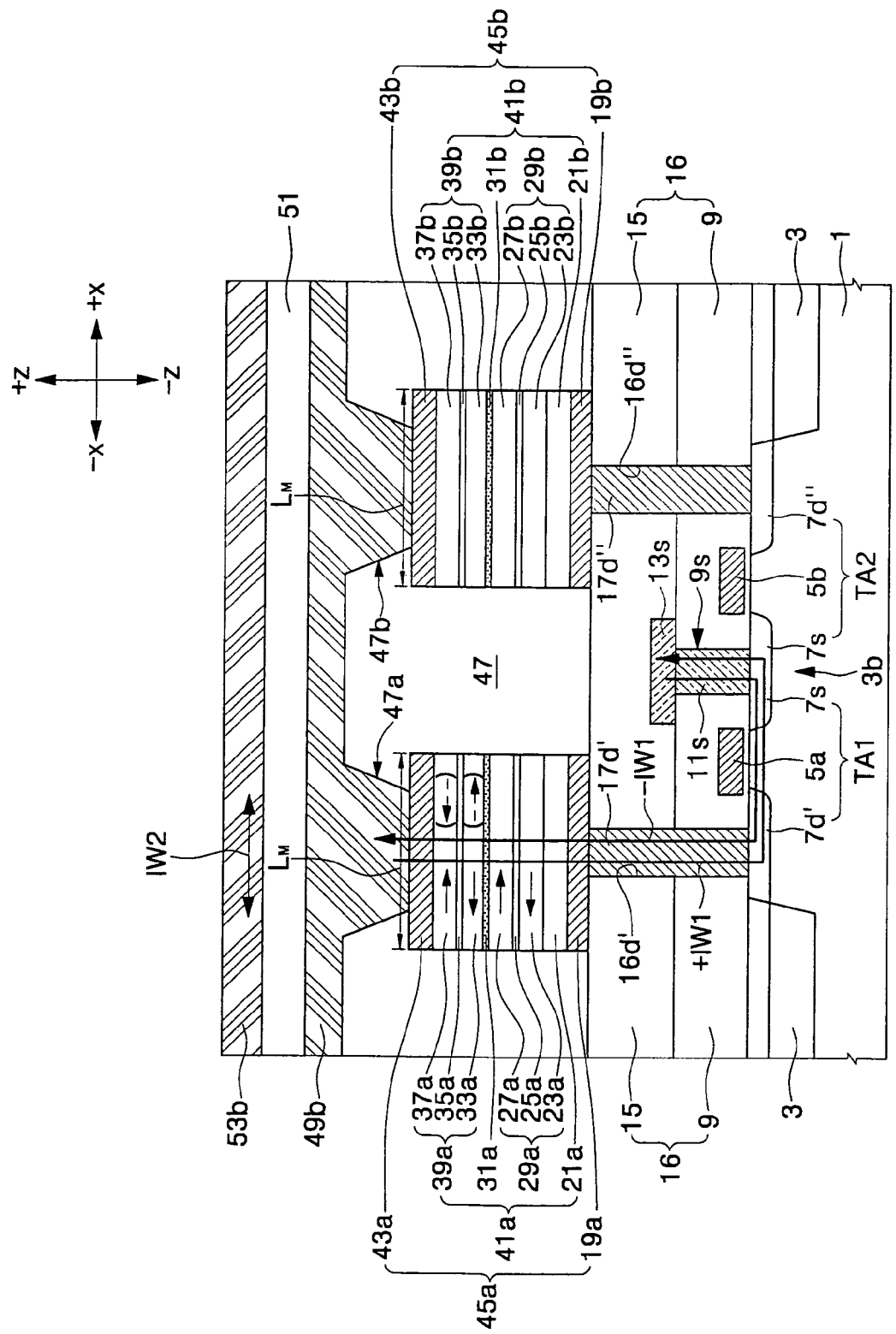
FIG. 2 is a cross-sectional view taken along section line I–I' of FIG. 1.
Figure 3:
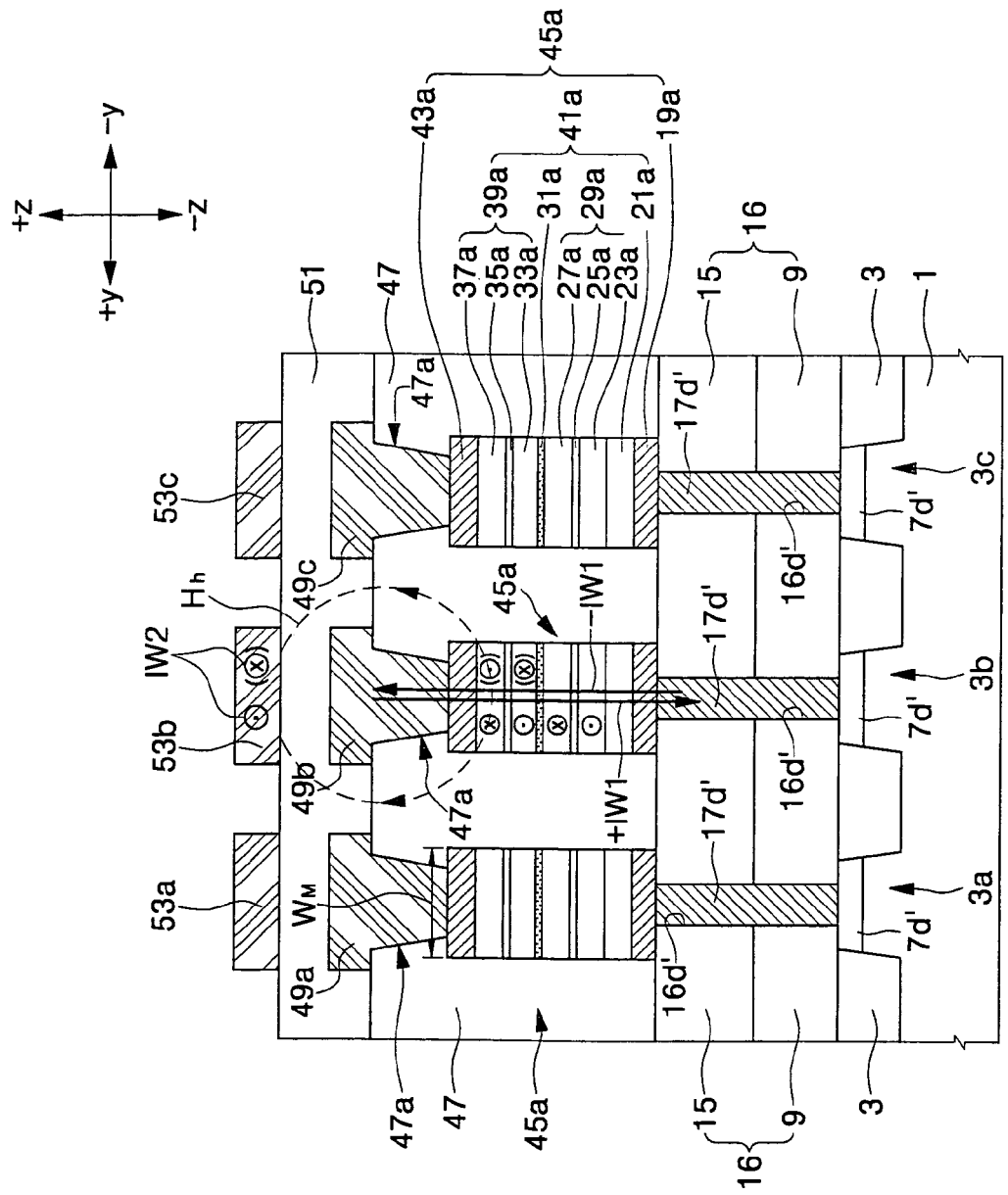
FIG. 3 is a cross-sectional view taken along section line II–II' of FIG. 1.
Figure 4:
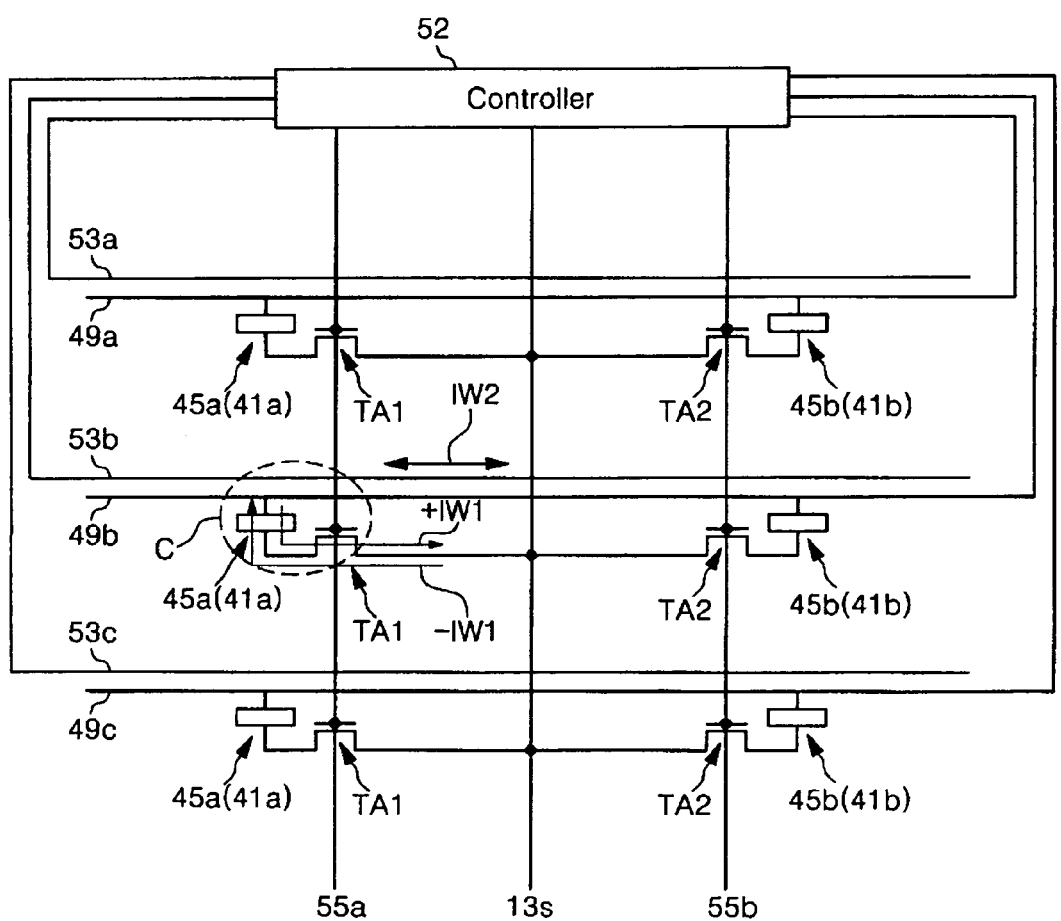
FIG. 4 is a schematic diagram illustrating circuits of the MRAM device of FIG. 1.

FIG. 1 is a plan view illustrating portions of an MRAM device suitable for of programming operations according to embodiments of the present invention. FIGS. 2 and 3 are cross-sectional views taken along the lines I–I' and II–II' of FIG. 1, respectively. In addition, FIG. 4 is schematic diagram illustrating circuits of the MRAM device shown in FIG. 1.

Referring to FIGS. 1 to 4, an isolation layer 3 is provided in regions of an integrated circuit substrate 1 to define first, second, and third active regions 3a, 3b, and 3c. First and second drain regions 7d' and 7d" are provided at opposite ends of each of the active regions 3a, 3b, and 3c, and common source regions 7s are provided between the first and second drain regions 7d' and 7d" in each active region. First gate electrodes 5a are provided over first channel regions between the first drain regions 7d' and the common source regions 7s, and second gate electrodes 5b are provided over second channel regions between the second drain regions 7d" and the common source regions 7s. The first gate electrodes 5a may cross over the active regions 3a, 3b and 3c and the isolation layer 3 to provide a first word line 55a. Similarly, the second gate electrodes 5b may cross the active regions 3a, 3b, and 3c and the isolation layer 3 to provide a second word line 55b. A pair of switching devices, (i.e., first and second access MOS transistors TA1 and TA2), sharing a common source region 7s, may thus be provided at each of the active regions 3a, 3b and 3c. The first access MOS transistor TA1 of each active region may include the first drain region 7d', the common source region 7s, and the first word line 55a. The second access MOS transistor TA2 of each active region may include the second drain region 7d", the common source region 7s, and the second word line 55b.

A first lower inter-layer insulating layer 9 may be provided on the substrate and on the first and second access MOS transistors TA1 and TA2. Portions of the common source regions 7s may be exposed by common source line contact holes 9s through the first lower inter-layer insulating layer 9, and the common source line contact holes 9s may be filled with source contact plugs 11s. The source contact plugs 11s may be covered with a common source line 13s that crosses over the active regions 3a, 3b, and 3c and the isolation layer 3. The common source line 13s may thus be electrically connected to the common source regions 7s through the source contact plugs 11s.

A first upper inter-layer insulating layer 15 is provided on the substrate and on the common source line 13s. The first lower inter-layer insulating layer 9 and the first upper inter-layer insulating layer 15 provide a first inter-layer insulating layer 16. Portions of the first drain regions 7d' may be exposed by first drain contact holes 16d' through the first inter-layer insulating layer 16, and portions of the second drain regions 7d" may be exposed by second drain contact holes 16d" through the first inter-layer insulating layer 16. The first and second drain contact holes 16d' and 16d" may be filled with respective first and second drain contact plugs 17d' and 17d". Each of the first drain contact plugs 17d' may thus be electrically connected to the respective first drain region 7d', and each of the second drain contact plugs 17d" may be electrically connected to the respective second drain regions 7d".

First magnetic resistors 45a and second magnetic resistors 45b are provided on the first inter-layer insulating layer 16. More particularly, the first magnetic resistors 45a and second magnetic resistors 45b are respectively provided on the first drain contact plugs 17d' and the second drain contact plugs 17d". Each of the first magnetic resistors 45a may include a first bottom electrode 19a, a first top electrode 43a, and a first magnetic tunnel junction (MTJ) structure 41a therebetween. The first MTJ structure 41a may include a first pinned layer 29a, a first free layer 39a, and a first tunneling insulating layer 31a therebetween. Furthermore, the first MTJ structure 41a may include a first pinning layer 21a in contact with the first pinned layer 29a. The layers (19a, 21a, 29a, 31a, 39a and 43a) of the first magnetic resistors 45a may be stacked in different arrangements. For example, the first bottom electrodes 19a may be provided in contact with the first drain contact plugs 17d'; and the first pinning layers 21a, the first pinned layers 29a, the first tunneling insulating layers 31a, and the first free layers 39a may be sequentially stacked on the first bottom electrodes 19a.

The second magnetic resistors 45b may include a second bottom electrode 19b, a second top electrode 43b and a second MTJ structure 41b therebetween. The second MTJ structure 41b may include a second pinned layer 29b, a second free layer 39b, and a second tunneling insulating layer 31b therebetween. Furthermore, the second MTJ structure 41b may include a second pinning layer 21b in contact with the second pinned layer 29b. The layers (19b, 21b, 29b, 31b, 39b and 43b) of the second magnetic resistors 45b may be stacked to provide the same structure as the first magnetic resistor 45a.

Each of the first free layers 39a may be a single layer of ferromagnetic material. In an alternative, each of the first free layers 39a may be a synthetic anti-ferromagnetic (SAF) layer having a first bottom ferromagnetic layer 33a, a first anti-ferromagnetic coupling spacer layer 35a, and a first top ferromagnetic layer 37a which are sequentially stacked as shown in FIGS. 2 and 3. Similarly, each of the second free layers 39b may be a single layer of ferromagnetic material. In an alternative, each of the second free layers 39b may be an SAF layer having a second bottom ferromagnetic layer 33b, a second anti-ferromagnetic coupling spacer layer 35b, and a second top ferromagnetic layer 37b which are sequentially stacked as shown in FIGS. 2 and 3.

Furthermore, each of the first pinned layers 29a may be a single layer of ferromagnetic material, or an SAF layer (having a first bottom ferromagnetic layer 23a, a first anti-ferromagnetic coupling spacer layer 25a, and a first top ferromagnetic layer 27a which are sequentially stacked as shown in FIGS. 2 and 3). Each of the second pinned layers. 29b may also be a single layer of ferromagnetic material, or an SAF layer (having a second bottom ferromagnetic layer 23b, a second anti-ferromagnetic coupling spacer layer 25b, and a second top ferromagnetic layer 27b which are sequentially stacked as shown in FIGS. 2 and 3).

A second inter-layer insulating layer 47 is provided on the first inter-layer insulating layer 16 to cover the first and second magnetic resistors 45a and 45b. The first top electrodes 43a of the first magnetic resistors 45a may be exposed by first bit line contact holes 47a through the second inter-layer insulating layer 47, and the second top electrodes 43b of the second magnetic resistors 45b may be exposed by second bit line contact holes 47b through the second inter-layer insulating layer 47. First, second and third bit lines 49a, 49b, and 49c are provided on the second inter-layer insulating layer 47. The first bit line 49a is electrically connected to the first and second magnetic resistors 45a and 45b on the first active region 3a through the first and second bit line contact holes 47a and 47b which expose the first and second top electrodes 43a and 43b over the first active region 3a. The second bit line 49b is electrically connected to the first and second magnetic resistors 45a and 45b on the second active region 3b through the first and second bit line contact holes 47a and 47b which expose the first and second top electrodes 43a and 43b over the second active region 3b. Similarly, the third bit line 49c is electrically connected to the first and second magnetic resistors 45a and 45b on the third active region 3c through the first and second bit line contact holes 47a and 47b which expose the first and second top electrodes 43a and 43b over the third active region 3c. Each of the bit lines 49a, 49b, and 49c may cross over the word lines 55a and 55b.

A third inter-layer insulating layer 51 is provided on the bit lines 49a, 49b, and 49c, and on the second inter-layer insulating layer 47. First to third auxiliary interconnection lines (i.e., first to third sub bit lines 53a, 53b, and 53c) may be provided on the third inter-layer insulating layer 51. The sub bit lines 53a, 53b and 53c may be located over the respective bit lines 49a, 49b and 49c. In particular, the sub bit lines 53a, 53b and 53c may be parallel with respect to the bit lines 49a, 49b and 49c and lengths $L_M$ of the magnetic resistors 45a and 45b. As shown in FIG. 4, a controller 52 may be electrically coupled to the bit lines 49a, 49b, and 49c, to the sub bit lines 53a, 53b, and 53c, and to the word lines 55a and 55b. and to the common source line 13s. Operations of the controller 52 are discussed in greater detail below.

Figure 5:
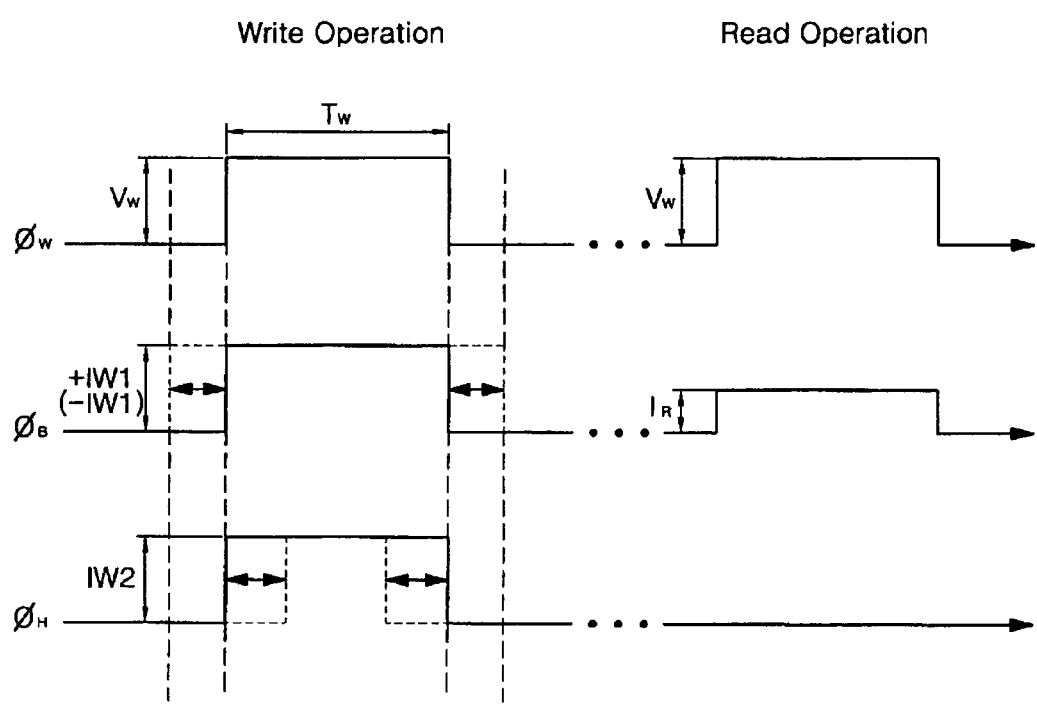
FIG. 5 is a timing diagram illustrating programming operations according to embodiments of the present invention.

FIG. 5 is a timing diagram illustrating programming operations (i.e., writing operations) according to embodiments of the present invention. Referring to FIGS. 1 to 5, first and second writing signals are applied by controller 52 to respective word and bit lines. More particularly, a word line signal $\Phi_w$ is applied by controller 52 to one of the word lines 55a or 55b, and a main writing signal $\Phi_b$ is applied by controller 52 to one of the bit lines 49a, 49b, or 49c. The word line signal $\Phi_w$ may be a voltage pulse signal having a word line voltage $V_w$ greater than a threshold voltage of the access MOS transistors TA1 and TA2 for a time duration of $T_w$. Accordingly, the access MOS transistors connected to the selected word line are turned on responsive to voltage $V_w$. The main writing signal $\Phi_B$ may be a current pulse signal that forces a current (such as a writing current pulse) through the selected bit line during application of the word line signal $\Phi_w$. As a result, an MRAM cell connected between the selected word line and the selected bit line may be selectively operated. Accordingly, current (such as a writing current pulse) may flow through the MTJ structure and the access MOS transistor of the selected MRAM cell. For example, when the word line signal $\Phi_w$ is applied by controller 52 to the first word line 55a and the main wnting signal $\Phi_B$ is applied by controller 52 to the second bit line 49b, an MRAM cell C connected between the first word line 55a and the second bit line 49b is selected, and the main writing current (such as a writing current pulse) may flow through the MTJ structure 41a of the selected MRAM cell C.

The main writing current may be a positive writing current +IW1 that flows from the free layer 39a of the selected MTJ structure 41a toward the pinned layer 29a of the selected MTJ structure 41a or a negative writing current −IW1 that flows from the selected pinned layer 29a toward the selected free layer 39a. In other words, the positive writing current +IW1 flows toward a negative z-axis direction (e.g. toward the substrate) in the selected MTJ structure 41 a as shown in FIGS. 2 and 3, and the negative writing current −IW1 flows toward a positive z-axis direction (e.g. away from the substrate) as shown in FIGS. 2 and 3. Stated in other words, electrons flow in the positive z-axis direction while the positive writing current +IW1 flows, and electrons flow in the negative z-axis direction while the negative writing current −IW1 flows.

When the common source line 13s is grounded during a program operation (i.e. write operation), the positive writing current +IW1 may be generated by controller 52 by applying a first positive program voltage +VP1 to the selected bit line (i.e., the second bit line 49b). Similarly, when the common source line 13s is grounded during the program operation (write operation), the negative writing current −IW1 may be generated by controller 52 by applying a first negative program voltage −VP1 to the selected bit line (i.e., the second bit line 49b).

When the positive writing current +IW1 flows through the selected MTJ structure 41a, most of the electrons passing through the selected pinned layer 29a may be changed to have spins exhibiting a same magnetization direction as the fixed magnetic polarization in the selected pinned layer 29a. For example, when majority of magnetic polarizations in the selected pinned layer 29a have up-spins, most of the electrons passing through the selected pinned layer 29a may have up-spins. In particular, when the selected pinned layer 29a is a SAF layer as described above, most of the electrons may have spins of the same magnetization direction as the top ferromagnetic layer 27a of the SAF pinned layer.

The up-spin electrons pass through the tunneling insulating layer 31a to reach the selected free layer 39a. The number of up-spin electrons reaching the selected free layer 39 may be proportional to a current density of the positive writing current +IW1. With a positive writing current of sufficient current density, the selected free layer 39a may have a plurality of magnetization polarizations that are parallel with respect to the fixed magnetization polarizations in the selected pinned layer 29a regardless of an initial magnetization direction. This effect may be due to the injection of up-spin electrons into the selected free layer 39a. When the selected free layer 39a is an SAF layer as described above, the positive writing current +IW1 may make magnetization polarizations of the bottom ferromagnetic layer 33a of the SAF free layer parallel with respect to the fixed magnetization polarizations in the selected pinned layer 29a.

Alternatively, when both of the selected pinned layer 29a and the selected free layer 39a are SAF layers as shown in FIGS. 2 and 3, the positive writing current +IW1 may make the magnetization polarizations in the bottom ferromagnetic layer 33a of the SAF free layer 39a parallel with respect to the fixed magnetization polarizations in the top ferromagnetic layer 27a of the SAF pinned layer 29a. As a result, when the positive writing current density is greater than a specific current density, the selected MTJ structure 41a may be switched to have a relatively low resistance value.

When the negative writing current −IW1 flows through the selected MTJ structure 41a, electrons are injected into the selected free layer 39a. In this case, the infected electrons may include substantially equal numbers of up-spin electrons and down-spin electrons. If most of the fixed magnetization polarizations in the selected pinned layer 29a have the up-spins, primarily only the up-spin electrons of the electrons injected into the selected free layer 39a pass through the selected tunneling insulating layer 31a to reach the selected pinned layer 29a. The down-spin electrons injected into the selected free layer 39a, however, may primarily accumulate in the selected free layer 39a. Quantities of the up-spin electrons and the down-spin electrons injected into the selected free layer 39a may also be proportional to the current density of the negative writing current −IW1. Accordingly, when a negative writing current of sufficient current density is provided, the selected free layer 39a may have a majority magnetic polarizations that are anti-parallel with respect to a magnetization direction of the selected pinned layer 29a regardless of an initial magnetization direction of the selected free layer. As a result, when the negative writing current density is greater than a threshold current density, the selected MTJ structure 41a may be switched to have a relatively high resistance value.

To switch (i.e., program) the selected MRAM cell using a spin injection mechanism as discussed above, the writing current density should be greater than the threshold current density. The access MOS transistor should thus provide current drive sufficient to generate a writing current density greater than the threshold current density. When a selected MRAM cell is programmed using the spin injection mechanism, it may be difficult to scale down a size of the access MOS transistors to provide higher integration density. Accordingly, it may be difficult to provide higher integration densities for MRAM devices. Accordingly, embodiments of the present invention may apply an auxiliary signal in addition to the main writing signal to provide writing operations (programming operations) capable of reducing a writing current density used to successfully switch the selected MRAM cell.

Referring again to FIGS. 1 to 5, programming methods according to embodiments of the present invention may include applying an auxiliary writing signal $\Phi_H$ to generate a hard magnetic field $H_h$ (such as a writing magnetic field pulse) for the selected MTJ structure 41a while applying the word line signal $\Phi_w$ and the main writing signal $\Phi_B$. The hard magnetic field $H_h$ (such as a writing magnetic field pulse) is a magnetic field parallel with respect to a direction crossing the selected MTJ structure 41a (i.e., parallel to a width $W_M$ direction of the selected MTJ structure 41a). Accordingly, the hard magnetic field $H_h$ may be induced using an auxiliary writing current IW2 that flows through an auxiliary interconnection line provided adjacent to and parallel with respect to the selected MTJ structure 41a. Moreover, the an auxiliary writing signal $\Phi_H$, the word line signal $\Phi_w$, and the main writing signal $\Phi_B$ may be generated by controller 52.

More particularly, the auxiliary writing current IW2 may be generated by controller 52 by applying a second program voltage VP2 to the second sub bit line 53b provided over the selected MTJ structure 41a as shown in FIGS. 2 and 3. The auxiliary writing current IW2 may flow in a positive x-axis direction or a negative x-axis direction regardless of a direction of the main writing current (+IW1 or −IW1). When the auxiliary writing current IW2 flows in the positive x-axis direction, the hard magnetic field $H_h$ through the selected free layer 39a may be in the direction of the positive y-axis direction in the selected MTJ structure 41a. When the auxiliary writing current IW2 flows in the negative x-axis direction, the hard magnetic field $H_h$ through the selected free layer 39a may be in the direction of the negative y-axis direction in the selected MTJ structure 41a.

If the hard magnetic field $H_h$ is generated while the main writing current flows, the selected MTJ structure 41a may be more easily switched due to the presence of the hard magnetic field Hh. For example, when the hard magnetic field Hh is generated while the positive writing current +IW1 flows, the magnetic polarizations in the selected free layer 39a may be arranged parallel with respect to the magnetic polarizations in the selected pinned layer 29a with aid of the hard magnetic field $H_h$ even though the positive writing current +IW1 may be reduced. Similarly, when the hard magnetic field $H_h$ is generated while the negative writing current −IW1 flows, the magnetic polarizations in the selected free layer 39a may be arranged anti-parallel with respect to the magnetic polarizations in the selected pinned layer 29a with aid of the hard magnetic field $H_h$ even though the negative writing current −IW1 is reduced. By using the hard magnetic field $H_h$, a main writing current used to successfully switch the selected MTJ structure 41a may be reduced.

The main writing signal $\Phi_B$ may be turned on by controller 52 before the word line voltage $V_w$ is applied, and/or the main writing signal $\Phi_B$ may be continuously applied by controller 52 for a period of time after the word line voltage $V_w$ is turned off. In addition, the auxiliary writing signal $\Phi_H$ may be turned on by controller after the main writing current (+IW1 or −IW1) is initially forced through the selected MTJ structure 41a. Furthermore, the auxiliary writing signal $\Phi_H$ may be turned off by controller before the main writing current (+IW1 or −IW1) through the selected MTJ structure is stopped. The auxillary writing signal $\Phi_H$ may be turned on by controller after the main writing current (+IIW1) is initiated and turned off before the main writing current is terminated because the magnetic polarizations in the selected free layer 39a may have an unstable state if the auxiliary writing current IW2 (and the resulting magnetic field) is continuously provided after the main writing signal $\Phi_B$ is turned off.

While the selected MRAM cell C is being programmed, a voltage lower than the threshold voltage of the access MOS transistors TA1 and TA2 may be applied to the non-selected word line (i.e., the second word line 55b), thereby turning off the second access MOS transistors TA2 connected to the second word line 55b. For example, the second word line 55b may be grounded during the program operation. In addition, the non-selected bit lines (i.e., the first and third bit lines 49a and 49c), may float or may have the same potential as the common source line 13s (i.e. ground) during the program operation.

Reading data stored in a selected MRAM cell may be achieved as shown in FIG. 5 by the controller 52 applying a read voltage $V_R$ across the MTJ structure of the selected MRAM cell. To read out the data stored in the selected MRAM cell C, for example, the word line voltage $V_w$ shown in FIG. 5 may be applied by controller 52 to the first word line 55a to turn on the first access MOS transistors TA1 connected to the first word line 55a, and the ground voltage and the read voltage $V_R$ may be applied by controller 52 to the common source line 13s and the second bit line 49b, respectively. A read current $I_R$ may thus flow through the MTJ structure of the selected MRAM cell C, and data of the selected MRAM cell may be discriminated as logic "0" or logic "1" according to a magnitude of the resulting read current $I_R$. Moreover, the read current $I_R$ may be lower than the main writing current. Moreover, the read voltage $V_R$ generated across the selected MTJ structure during a read operation may be less than a write voltage generated across the selected MTJ structure when providing a writing current pulse during a write operation. As discussed below with respect to FIGS. 10, for example, a relatively low bit line voltage of about 0.1 to about 0.2 volts may be used as the read voltage. As discussed below with respect to FIG. 11, for example, the bit line voltage $V_B$ used to switch the magnetic resistor may vary between about 0.3 volts and about 0.9 volts as a function of the auxiliary writing current IW2.

Writing and reading operations according to embodiments of the present invention may thus be summarized as provided below in Table 1.

TABLE 1

|  | Program mode | Read mode |
|---|---|---|
| Common source line | 0 V | 0 V |
| Selected word line | $V_w$ | $V_w$ |
| Non-selected word line | 0 V | 0 V |
| Selected bit line | +VPI (+IW1) or −VPI (−IW1) | $V_R$ |
| Non-selected bit line | 0 V (or floating) | 0 V (or floating) |
| Selected auxiliary interconnection line | VP2 (IW2) | 0 V (or floating) |
| Non-selected auxiliary interconnection line | 0 V (or floating) | 0 V (or floating) |

Writing and reading operations according to embodiments of the present invention discussed above are not limited to devices having MRAM cell structures discussed above with respect to FIGS. 1 to 4, but may also be applied to MRAM devices having other structures. For example, writing operations according to embodiments of the present invention may also be applicable to devices having MRAM cell array regions illustrated in FIGS. 6 to 9.

Figure 6:
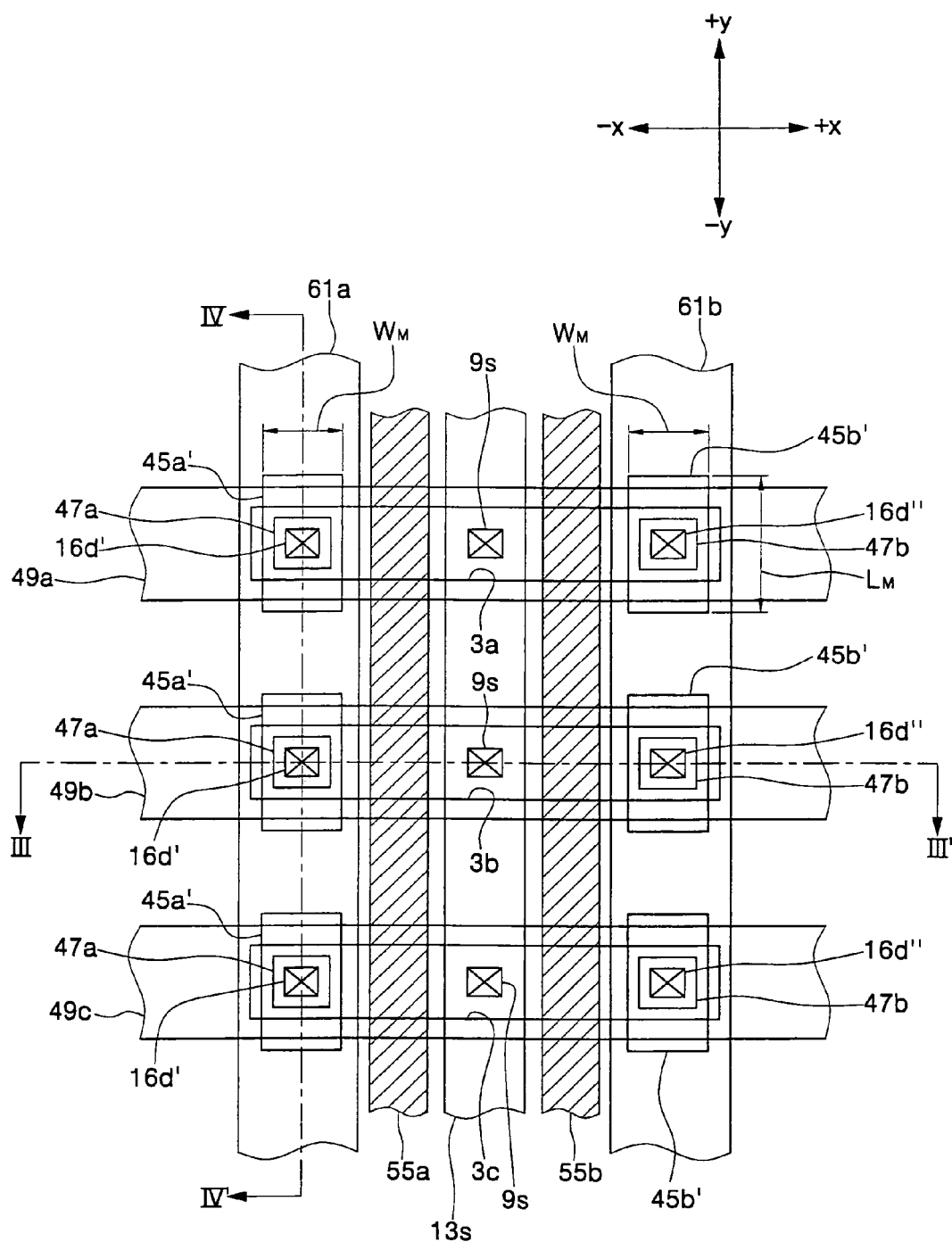
FIG. 6 is a plan view illustrating a portion of other MRAM devices suitable for programming operations according to embodiments of the present invention.
Figure 7:
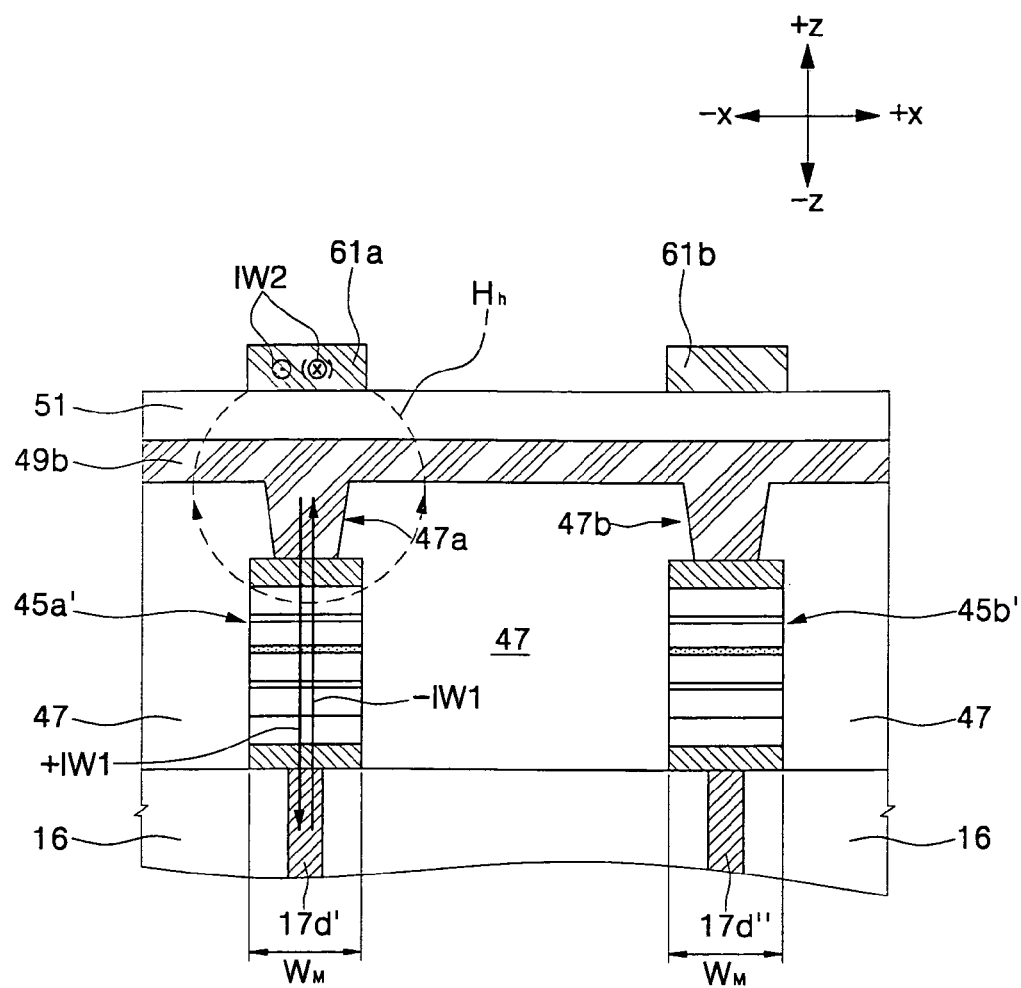
FIG. 7 is a cross-sectional view taken along section line III–III' of FIG. 6.
Figure 8:
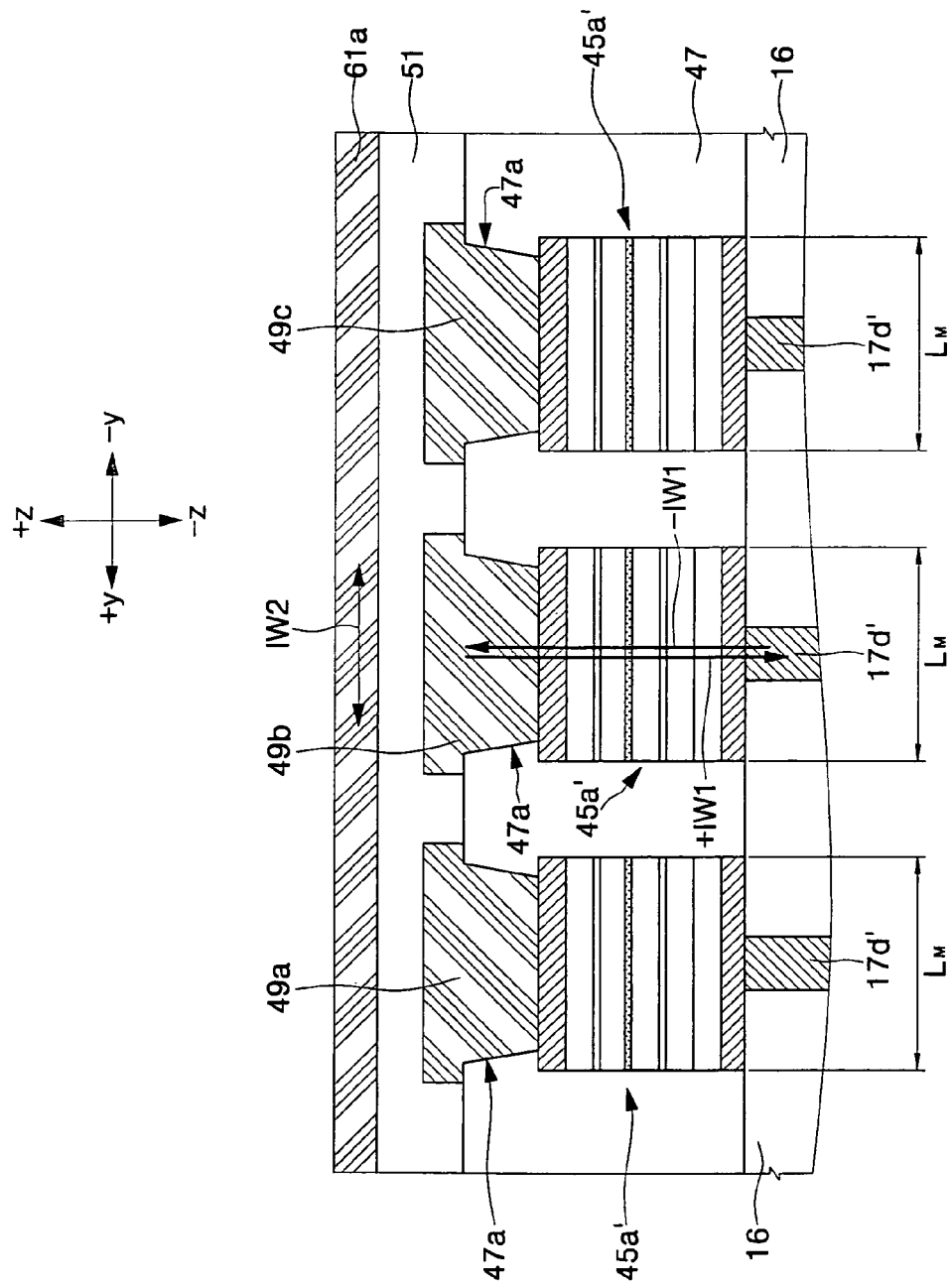
FIG. 8 is a cross-sectional view taken along section line IV–IV' of FIG. 6.
Figure 9:
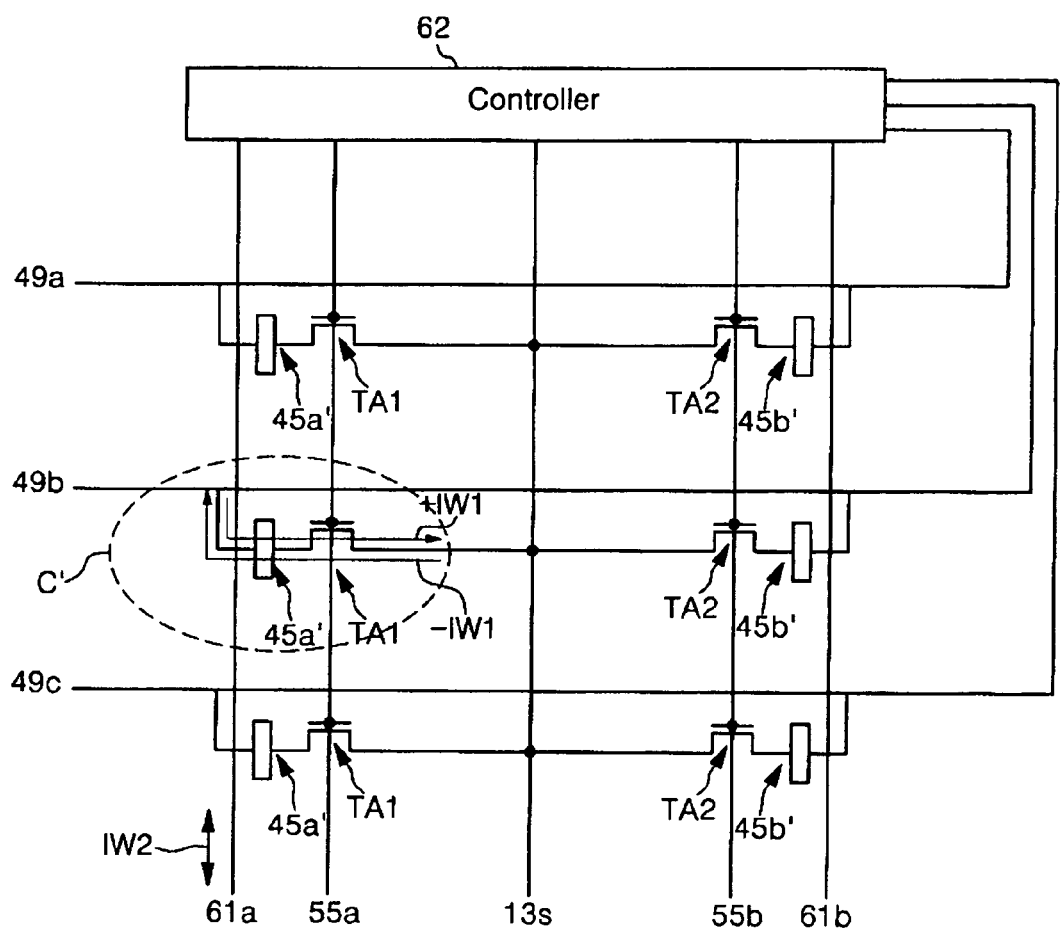
FIG. 9 is a schematic diagram illustrating circuits of the MRAM device of FIG. 6.

FIG. 6 is a plan view illustrating portions of an MRAM cell array region suitable for writing methods described with respect to FIG. 5 according to additional embodiments of the present invention. FIGS. 7 and 8 are cross-sectional views taken along section lines III–III' and IV–IV' of FIG. 6 respectively. FIG. 9 is an equivalent circuit of the MRAM cell array region of FIG. 6.

Referring to FIGS. 6–9, all structures from an integrated circuit substrate 1 to a first inter-layer insulating layer 16 may be the same as those discussed above with reference to FIGS. 1 to 4. First and second drain contact plugs 17d' and 17d'' through the first inter-layer insulating layer 16 may also have a structure the same as that discussed above with reference to FIGS. 1 to 4. First and second magnetic resistors 45a' and 45b' may be provided on the first inter-layer insulating layer 16. The first magnetic resistors 45a' may be provided on respective first drain contact plugs 17d', and the second magnetic resistors 45b' may be provided on respective second drain contact plugs 17d''.

The magnetic resistors 45a' and 45b' may have a same shape (e.g., a rectangular shape or an elliptical shape) as the magnetic resistors 45a and 45b discussed above with respect to FIGS. 1 to 4 when viewed from a direction perpendicular to the substrate. Each of the magnetic resistors 45a' and 45b' may thus have a width $W_M$ and a length $L_M$ greater than the width $W_M$. Lengths $L_m$ of the first and second magnetic resistors 45a' and 45b', however, may be arranged parallel with respect to the word lines 55a and 55b as shown in FIGS. 6–8. In other words, the first-and second magnetic resistors 45a' and 45b' may be parallel with respect to the y-axis. The first and second magnetic resistors 45a' and 45b' may have a same stacked structure as the first and second magnetic resistors 45a and 45b discussed above with respect to FIGS. 1–3.

The second inter-layer insulating layer 47, the bit lines 49a, 49b and 49c, and the third inter-layer insulating layer 51, may be provided on the substrate and on the first and second magnetic resistors 45a' and 45b' as discussed above with respect to FIGS. 1–3. The first bit line 49a may thus be electrically connected to the first and second magnetic resistors 45a' and 45b' over the first active region 3a. The second bit line 49b may be electrically connected to the first and second magnetic resistors 45a' and 45b' over the second active region 3b. Similarly, the third bit line 49c may be electrically connected to the first and second magnetic resistors 45a' and 45b' over the third active region 3c.

First and second digit lines 61a and 61b may be provided on the third inter-layer insulating layer 51. The first and second digit lines 61a and 61b may cross over the bit lines 49a, 49b, and 49c so that the first and second digit lines 61a and 61b are parallel with respect to the magnetic resistors 45a' and 45b'. In addition, the first digit line 61a may be located over the first magnetic resistors 45a', and the second digit line 61b may be located over the second magnetic resistors 45b'. Accordingly, current flowing through the first digit line 61a may generate a hard magnetic field $H_h$ for the first magnetic resistors 45a', and current flowing through the second digit line 61b may generate a hard magnetic field $H_h$ for the second magnetic resistors 45b'.

Methods of selectively programming a selected MRAM cell of devices illustrated in in FIGS. 6–9 will be discussed with reference to FIG. 5. First, the word line signal $\Phi_w$ and the main writing signal $\Phi_B$ may be applied by controller 62 to one of the word lines 55a and 55b and to one of the bit lines 49a, 49b and 49c, respectively. An MRAM cell connected between the selected word line and the selected bit line may thus be selected. For example, when the word line signal $\Phi_W$ and the main writing signal $\Phi_B$ are respectively applied by controller 62 to the first word line 55a and the second bit line 49b, an MRAM cell C' connected between the first word line 55a and the second bit line 49b may be selected and the positive writing current +IW1 or the negative writing current −IW1 may flow through a magnetic resistor 41a' of the selected MRAM cell C'.

When the auxiliary writing signal $\Phi_H$ (i.e., the auxiliary writing current IW2) is applied by controller 62 to the first digit line 61a while the word line signal $\Phi_W$ and the main writing signal $\Phi_B$ are applied by controller 62, a hard magnetic field $H_h$ (such as a writing magnetic field pulse) may be generated for the selected magnetic resistor 41a'. In this case, the hard magnetic field $H_h$ through the selected magnetic resistor 41a' may be in the direction of the positive x-axis or the negative x-axis. When the main writing signal $\Phi_B$ is the positive writing current +IW1, the selected magnetic resistor 41a' may be switched to have a relatively low resistance value. When the main writing signal $\Phi_B$ is the negative writing current −IW1, the selected magnetic resistor 41a' may be switched to have a relatively high resistance value.

Figure 10:
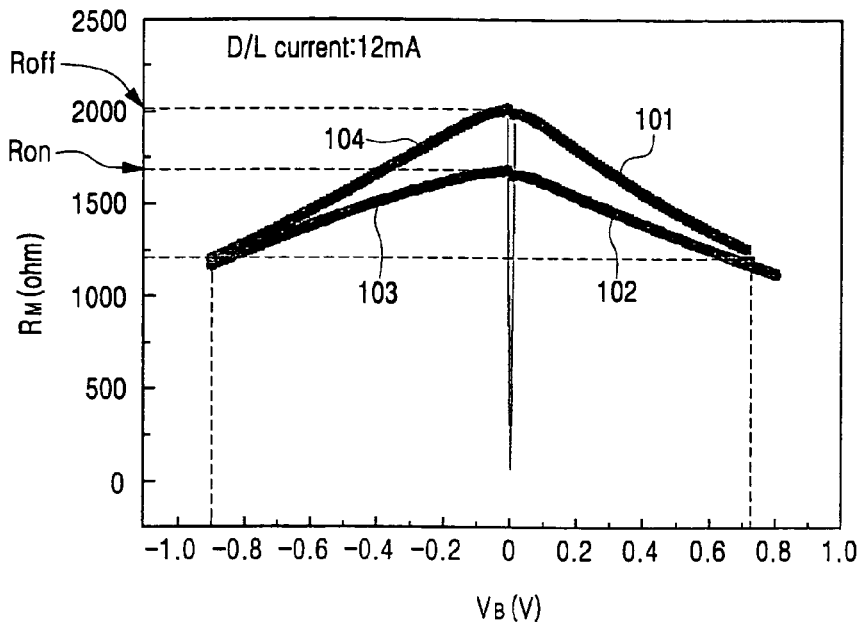
FIG. 10 is a graph illustrating a switching loop of a magnetic resistor to which programming operations according to embodiments of the present invention are applied.

FIG. 10 is a graph illustrating a switching loop of an MRAM cell to which writing operations according to embodiments of the present invention are applied. In the graph of FIG. 10, the horizontal axis indicates a bit line voltage $V_B$ applied to a bit line electrically connected to the MRAM cell to generate a main writing current passing through a magnetic resistor of the selected MRAM cell. The vertical axis indicates an electrical resistance $R_M$ of the magnetic resistor in response to the bit line voltage $V_B$. The switching loop of FIG. 10 is provided for an MRAM cell having a structure as discussed above with respect to FIGS. 6–9. In other words, the MRAM cell is provided with a digit line crossing over the bit line, and the magnetic resistor is provided parallel with respect to the digit line.

The magnetic resistor may have a width of about 0.35 µm (micrometers) and a length of about 0.85 µm (micrometers) when viewed from a direction perpendicular to the substrate. A digit line current of 12 mA (i.e. an auxiliary writing current) may be provided through the digit line while the bit line voltage $V_B$ is applied. In addition, the MTJ structure of the magnetic resistor may include a pinning layer, an SAF pinned layer, a tunneling insulating layer and an SAF free layer sequentially stacked. The pinning layer may include a PtMn layer having a thickness of about 150 Å (Angstroms), and the SAF pinned layer may include a bottom CoFe layer having a thickness of about 15 Å (Angstroms), a ruthenium layer having a thickness of about 8 Å (Angstroms), and a top CoFe layer having a thickness of about 15 Å (Angstroms). The tunneling insulating layer may include an aluminum oxide layer having a thickness of about 12 Å (Angstroms), and the SAF free layer may include a bottom NiFe layer having a thickness of about 30 Å (Angstroms), a ruthenium layer having a thickness of about 8 Å (Angstroms), and a top NiFe layer having a thickness of about 15 Å (Angstroms). As a result, a lower surface of the tunneling insulating layer (aluminum oxide layer) may be directly on the top CoFe layer of the SAF pinned layer. The bottom NiFe layer of the SAF free layer may be directly on an upper surface of the tunneling insulating layer (aluminum oxide layer).

For the purpose of explanation, the magnetic resistor may have a logic "0" state when the magnetic polarizations in the free layer (bottom NiFe layer) are parallel with respect to the magnetic polarizations in the pinned layer (top CoFe layer) to provide a relatively low resistance state. The magnetic resistor may have a logic "1" state when the magnetic polarizations in the free layer (bottom NiFe layer) are anti-parallel with respect to the magnetic polarizations in the pinned layer (top CoFe layer) to provide a relatively high resistance state.

Referring to FIG. 10, when the magnetic resistor has a logic "1" state, the magnetic resistor may provide an off-resistance $R_{off}$ of about 2000 ohms at a low bit line voltage $V_B$ close to zero volts. When the bit line voltage $V_B$ increases toward a positive direction to generate a positive main writing current, the resistance $R_M$ of the magnetic resistor may decrease along a curve 101. When the bit line voltage $V_B$ reaches about +0.7 volts, the magnetic resistor may provide a resistance of about 1250 ohms and switching may then occur. When a positive main writing current having a relatively low current density of about 1.88 mA/um$^2$ is forced through the magnetic resistor, the magnetic resistor may be switched to have a logic "0" state. The resistance $R_M$ of the magnetic resistor having the logic "0" state may change along a curve 102 at a positive bit line voltage +$V_B$. In other words, the magnetic resistor having the logic "0" state may provide an on-resistance $R_{on}$ of about 1700 ohms at a low bit line voltage $V_B$ close to zero volts. Even though a positive main writing current with a current density higher than about 1.88 mA/um$^2$ may be forced to the magnetic resistor having the logic "0" state, the magnetic resistor may maintain its logic "0" state.

Subsequently, when a negative bit line voltage $-V_B$ is applied to the magnetic resistor having the logic "0" state, the resistance $R_M$ of the magnetic resistor decreases along a curve 103. When the bit line voltage $V_B$ reaches about $-0.9$ volts, the magnetic resistor may provide a resistance of about 1250 ohms and may then be switched to have a logic "1" state. In other words, when a negative main writing current having a low current density of about 2.42 mA/um$^2$ is forced through the magnetic resistor, the magnetic resistor may switch to have a logic "1" state. The resistance $R_M$ of the magnetic resistor having the logic "1" state may change along a curve 104 at the negative bit line voltage $-V_B$. The magnetic resistor having the logic "1" state may again provide an off-resistance $R_{off}$ of about 2000 ohms at a low bit line voltage $V_B$ close to zero volts as discussed above. The magnetic resistor may still maintain its logic "1" state even if a negative main writing current having a current density greater than 2.42 mA/um$^2$ is forced through the magnetic resistor having the logic "1" state.

Operations of reading data stored in an MRAM cell providing the measurement results of FIG. 10 may be performed by applying a word line voltage $V_W$ having a high level to the word line electrically connected to the selected MRAM cell and applying a read voltage $V_R$ to the bit line electrically connected to the selected MRAM cell, as described in Table 1. The read voltage $V_R$ may be a relatively low voltage of about zero volts because a difference between the off-resistance $R_{off}$ and the on-resistance $R_{on}$ of the MRAM cell (i.e., magnetic resistor) may increase with read voltages (i.e., bit line voltage) closer to zero volts as illustrated in the graph of FIG. 10. In other words, a sensing margin of the MRAM cell may be higher at relatively low read voltages (i.e., bit line voltage). With an MRAM cell providing the measurement results of FIG. 10, a relatively low bit line voltage of about 0.1 to about 0.2 volts may be used as the read voltage. A sensing margin of the MRAM cell may be increased because a difference between the off-resistance $R_{off}$ and the on-resistance $R_{on}$ of the magnetic resistor may be at least about 250 ohms.

Figure 11:
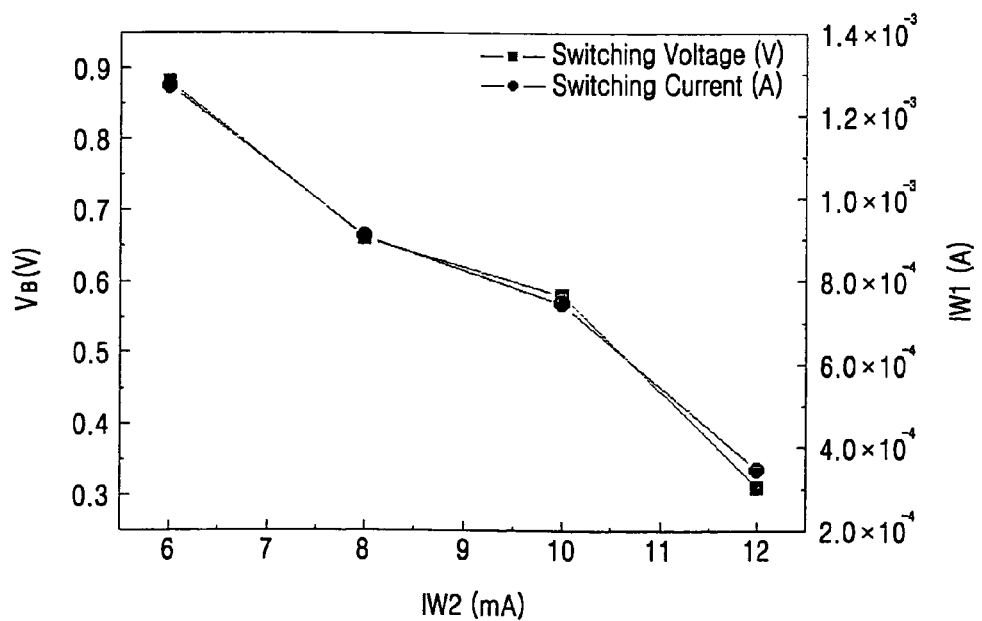
FIG. 11 is a graph illustrating a relationship between a main writing signal used to inject spins and an auxiliary writing signal used to generate a hard magnetic field in programming operations according to embodiments of the present invention.

FIG. 11 is a graph illustrating a relationship between a main writing signal used to inject magnetic spins and an auxiliary writing signal used to generate a hard magnetic field for a magnetic resistor in writing operations according to embodiments of the present invention. In FIG. 11, the horizontal axis indicates an auxiliary writing current IW2 used to generate a hard magnetic field, the left vertical axis indicates a bit line voltage $V_B$, and the right vertical axis indicates a main writing current IW1 corresponding to the bit line voltage $V_B$. The data shown in FIG. 11 is provided for a magnetic resistor having the switching characteristics of FIG. 10.

Referring to FIG. 11, when the auxiliary writing current IW2, (i.e., the digit line current) increases, the bit line voltage $V_B$ used to switch the magnetic resistor, (i.e., the main writing current IW1) may be reduced. For example, when the digit line current increases from about 6 mA to about 12 mA, the main writing current used to switch the magnetic resistor may be reduced from about 1.3 mA to about 0.3 mA.

According to embodiments of the present invention discussed above, a main writing current may be forced to pass through a MTJ structure of a selected MRAM cell and a hard magnetic field of the selected MRAM cell may be generated using an auxillary writing current to enhance a program efficiency of the selected MRAM cell. As a result, a main writing current used to switch the selected MRAM cell may be significantly reduced with aid of the hard magnetic field for the selected MRAM cell.

Operations and structures of memory devices of FIGS. 1–4 according to embodiments of the present invention are discussed below. As shown, the magnetic random access memory device may include a memory cell access transistor(s) TA1 on a substrate 1, a bit line 49b spaced apart from the substrate, and a magnetic tunnel junction structure 45a(41a) coupled between the bit line 49b and the memory cell access transistor TA1. A magnetic field conductive line 53b may be provided adjacent the magnetic tunnel junction structure 45a(41a) and separate from the bit line 49b. A controller 52 may be coupled to the memory cell access transistor TA1, to the bit line 49b, and to the magnetic field conductive line 53b. The controller 52 may be configured to provide a writing current pulse through the bit line 49b, through the magnetic tunnel junction structure 45a(41a), and through the memory cell access transistor TA1. The controller 52 may also be configured to provide a magnetic field current pulse through the magnetic field conductive line 53b to generate a writing magnetic field pulse through the magnetic tunnel junction structure 45a(41a). In addition, at least a portion of the magnetic field current pulse may be overlapping in time with respect to at least a portion of the writing current pulse. Moreover, at least a portion of the writing current pulse and/or at least a portion of the magnetic field current pulse may be non-overlapping in time with respect to the other.

The controller 52 may be configured to initiate the writing current pulse before initiating the magnetic field current pulse and/or to terminate the magnetic field current pulse before terminating the writing current pulse. More particularly, the controller 52 may be configured to initiate the writing current pulse before initiating the magnetic field current pulse and to terminate the magnetic field current pulse before terminating the writing current pulse. The magnetic tunnel junction structure 45a(41a) may include a magnetic resistor, and the controller 52 may be configured to provide the writing current pulse in a first direction through the magnetic tunnel junction structure 45a(41a) to program a relatively high resistance for the magnetic resistor, and the controller 52 may be configured to provide the writing current pulse in a second direction through the magnetic tunnel junction structure 45a(41a) to program a relatively low resistance for the magnetic resistor. The memory cell access transistor TA1 may be coupled between the magnetic tunnel junction structure 45a(41a) and a common source line 13s, and the controller 52 may be configured to provide the writing current pulse by turning on the memory cell access transistor TA1 and providing a voltage difference between the bit line 49b and the common source line 13s.

The mangetic tunnel unction structure 45a(41a) may have a length $L_M$ parallel with respect to a surface of the substrate 1 and a width $W_M$ parallel with respect to the surface of the substrate 1. The width $W_M$ may be perpendicular with respect to the length $L_M$, and the length $L_M$ may be greater than the width $W_M$. In addition the magnetic field conductive line 53b More particularly, the magnetic field conductive line 53a and the length $L_M$, of the magnetic tunnel junction structure 45a(41a) may be parallel with respect to the bit line 49a.

The controller 52 may be further configured to provide a read signal across the magnetic tunnel junction structure 45a(41a) after providing the writing current pulse and the writing magnetic field pulse, and to determine a program status of the magnetic tunnel junction structure 45a(41a) based on the read signal. Moreover, the controller 52 may provide the read signal by generating a read voltage across the magnetic tunnel junction structure 45a(41a) that is less than a write voltage generated across the magnetic tunnel junction structure when providing the writing current pulse.

Operations of the devices of FIGS. 6–9 according to embodiments of the present invention are discussed below. As shown, the magnetic random access memory device may include a memory cell access transistor(s) TA1 on a substrate, a bit line 49b spaced apart from the substrate, and a magnetic tunnel junction structure 45a' coupled between the bit line 49b and the memory cell access transistor TA1. A magnetic field conductive line 61a (also referred to as a digit line) may be provided adjacent the magnetic tunnel junction structure 45a' and separate from the bit line 49b. A controller 62 may be coupled to the memory cell access transistor TA1, to the bit line 49b, and to the magnetic field conductive line 61a. The controller 62 may be configured to provide a writing current pulse through the bit line 49b, through the magnetic tunnel junction structure 45a', and through the memory cell access transistor TA1. The controller 62 may also be configured to provide a magnetic field current pulse through the magnetic field conductive line 61a to generate a writing magnetic field pulse through the magnetic tunnel junction structure 45a'. In addition, at least a portion of the magnetic field current pulse may be overlapping in time with respect to at least a portion of the writing current pulse. Moreover, at least a portion of the writing current pulse and/or at least a portion of the magnetic field current pulse may be non-overlapping in time with respect to the other.

The controller 62 may be configured to initiate the writing current pulse before initiating the magnetic field current pulse and/or to terminate the magnetic field current pulse before terminating the writing current pulse. More particularly, the controller 62 may be configured to initiate the writing current pulse before initiating the magnetic field current pulse and to terminate the magnetic field current pulse before terminating the writing current pulse. The magnetic tunnel junction structure 45a' may include a magnetic resistor, and the controller 62 may be configured to provide the writing current pulse in a first direction through the magnetic tunnel junction structure 45a' to program a relatively high resistance for the magnetic resistor, and the controller 62 may be configured to provide the writing current pulse in a second direction through the magnetic tunnel junction structure 45a' to program a relatively low resistance for the magnetic resistor. The memory cell access transistor TA1 may be coupled between the magnetic tunnel junction structure 45a' and a common source line 13s, and the controller 62 may be configured to provide the writing current pulse by turning on the memory cell access transistor TA1 and providing a voltage difference between the bit line 49b and the common source line 13s.

The magnetic tunnel unction structure 45a' may have a length $L_M$ parallel with respect to a surface of the substrate and a width $W_M$ parallel with respect to the surface of the substrate. The width $W_M$ may be perpendicular with respect to the length $L_M$, and the length $L_M$ may be greater than the width $W_M$. In addition, the magnetic field conductive line 61a may be parallel with respect to the length $L_M$ of the magnetic tunnel unction structure 45a'. More particularly the magnetic field conductive line 61a and the length $L_M$ of the magnetic tunnel junction structure 45a' may be perpendicular with respect to the bit line 49b.

The controller 62 may be further configured to provide a read signal across the magnetic tunnel junction structure 45a' after providing the writing current pulse and the writing magnetic field pulse, and to determine a program status of the magnetic tunnel junction structure 45a' based on the read signal. Moreover, the controller 62 may provide the read signal by generating a read voltage across the magnetic tunnel junction structure 45a' that is less than a write voltage generated across the magnetic tunnel junction structure when providing the writing current pulse.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A method of operating a magnetic random access memory device including a memory cell having a magnetic tunnel junction structure on a substrate, the method comprising:

providing a writing current pulse through the magnetic tunnel junction structure; and providing a writing magnetic field pulse through the magnetic tunnel junction structure wherein at least a portion of the writing magnetic field pulse is overlapping in time with respect to at least a portion of the writing current pulse, and wherein at least a portion of the writing current pulse is non-overlapping in time with respect to at least a portion of the writing magnetic field pulse and/or at least a portion of the writing magnetic field pulse is non-overlapping in time with respect to at least a portion of the writing current pulse.

2. A method according to claim 1 wherein an initiating of the writing current pulse precedes an initiating of the writing magnetic field pulse and/or wherein a terminating of the writing magnetic field pulse precedes a terminating of the writing current pulse.

3. A method according to claim 1 wherein an initiating of the writing current pulse precedes an initiating of the writing magnetic field pulse and wherein a terminating of the writing magnetic field pulse precedes a terminating of the writing current pulse.

4. A method according to claim 1 wherein the magnetic tunnel junction structure includes a magnetic resistor, wherein the writing current pulse is provided in a first direction through the magnetic tunnel junction structure to program a relatively high resistance for the magnetic resistor, and wherein the writing current pulse is provided in a second direction through the magnetic tunnel junction structure to program a relatively low resistance for the magnetic resistor.

5. A method according to claim 1 wherein the memory cell includes a memory cell access transistor coupled between the magnetic tunnel junction structure and a common source line, wherein the magnetic tunnel junction structure is coupled between a bit line and the memory cell access transistor, and wherein providing the writing current pulse includes turning on the memory cell access transistor and providing a voltage difference between the bit line and the common source line.

6. A method according to claim 5 wherein the magnetic random access memory device includes a magnetic field conductive line separate from the bit line, and wherein providing the writing magnetic field pulse comprises providing a magnetic field current pulse through the magnetic field conductive line.

7. A method according to claim 6 wherein the bit line is between the magnetic field conductive line and the magnetic tunnel junction structure.

8. A method according to claim 6 wherein the magnetic tunnel junction structure has a length parallel with respect to a surface of the substrate, wherein the magnetic tunnel junction structure has a width parallel with respect to the surface of the substrate and perpendicular with respect to the length, wherein the length is greater than the width, and wherein the magnetic field conductive line is parallel with respect to the length of the magnetic tunnel junction structure.

9. A method according to claim 8 wherein the magnetic field conductive line and the length of the magnetic tunnel junction structure are parallel with respect to the bit line.

10. A method according to claim 8 wherein the magnetic field conductive line and the length of the magnetic tunnel junction structure are perpendicular with respect to the bit line.

11. A method according to claim 1 wherein the magnetic tunnel junction structure includes a magnetic resistor having a pinned ferromagnetic layer, a free ferromagnetic layer, and a tunnel insulating layer between the pinned and free ferromagnetic layers.

12. A method according to claim 1 wherein at least one of the pinned ferromagnetic layer and or the free ferromagnetic layer comprises a synthetic anti-ferromagnetic layer.

13. A method according to claim 1 further comprising:
after providing the writing current pulse and the writing magnetic field pulse, providing a read signal across the magnetic tunnel junction structure; and
determining a program status of the magnetic tunnel junction structure based on the read signal.

14. A method according to claim 13 wherein providing the read signal comprises generating a read voltage across the magnetic tunnel junction structure that is less than a write voltage generated across the magnetic tunnel junction structure when providing the writing current pulse.

15. A method of operating a magnetic random access memory device including a memory cell having a magnetic tunnel junction structure connected between a bit line and a memory cell access transistor on a substrate, and including a magnetic field conductive line adjacent the memory cell and separate from the bit line, the method comprising:
providing a writing current pulse through the bit line, through the magnetic tunnel junction structure and through the memory cell access transistor; and
providing a magnetic field current pulse through the magnetic field conductive line to generate a writing magnetic field pulse through the magnetic tunnel junction structure wherein at least a portion of the magnetic field current pulse is overlapping in time with respect to at least a portion of the writing current pulse.

16. A method according to claim 15 wherein at least a portion of the writing current pulse is non-overlapping in time with respect to at least a portion of the magnetic field current pulse and/or at least a portion of the magnetic field current pulse is non-overlapping in time with respect to at least a portion of the writing current pulse.

17. A method according to claim 15 wherein an initiating of the writing current pulse precedes an initiating of the magnetic field current pulse and/or wherein a terminating of the magnetic field current pulse precedes a terminating of the writing current pulse.

18. A method according to claim 15 wherein an initiating of the writing current pulse precedes an initiating of the magnetic field current pulse and wherein a terminating of the magnetic field current pulse precedes a terminating of the writing current pulse.

19. A method according to claim 15 wherein the magnetic tunnel junction structure includes a magnetic resistor, wherein the writing current pulse is provided in a first direction through the magnetic tunnel junction structure to program a relatively high resistance for the magnetic resistor, and wherein the writing current pulse is provided in a second direction through the magnetic tunnel junction structure to program a relatively low resistance for the magnetic resistor.

20. A method according to claim 15 wherein the memory cell access transistor is coupled between the magnetic tunnel junction structure and a common source line, and wherein providing the writing current pulse includes turning on the memory cell access transistor and providing a voltage difference between the bit line and the common source line.

21. A method according to claim 15 wherein the bit line is between the magnetic field conductive line and the magnetic tunnel junction structure.

22. A method according to claim 15 wherein the magnetic tunnel junction structure has a length parallel with respect to a surface of the substrate, wherein the magnetic tunnel junction structure has a width parallel with respect to the surface of the substrate and perpendicular with respect to the length, wherein the length is greater than the width, and wherein the magnetic field conductive line is parallel with respect to the length of the magnetic tunnel junction structure.

23. A method according to claim 22 wherein the magnetic field conductive line and the length of the magnetic tunnel junction structure are parallel with respect to the bit line.

24. A method according to claim 22 wherein the magnetic field conductive line and the length of the magnetic tunnel junction structure are perpendicular with respect to the bit line.

25. A method according to claim 15 wherein the magnetic tunnel junction structure includes a magnetic resistor having a pinned ferromagnetic layer, a free ferromagnetic layer, and a tunnel insulating layer between the pinned and free ferromagnetic layers.

26. A method according to claim 25 wherein at least one of the pinned ferromagnetic layer and/or the free ferromagnetic layer comprises a synthetic anti-ferromagnetic layer.

27. A method according to claim 15 further comprising:
after providing the writing current pulse and the writing magnetic field pulse, providing a read signal across the magnetic tunnel junction structure; and
determining a program status of the magnetic tunnel junction structure based on the read signal.

28. A method according to claim 27 wherein providing the read signal comprises generating a read voltage across the magnetic tunnel junction structure that is less than a write voltage generated across the magnetic tunnel junction structure when providing the writing current pulse.

29. A magnetic random access memory device comprising:
a memory cell access transistor on a substrate;
a bit line spaced apart from the substrate;
a magnetic tunnel junction structure coupled between the bit line and the memory cell access transistor;
a magnetic field conductive line adjacent the magnetic tunnel junction structure and separate from the bit line; and
a controller coupled to the memory cell access transistor, the bit line, and the magnetic field conductive line, wherein the controller is configured to provide a writing current pulse through the bit line, through the magnetic tunnel junction structure and through the memory cell access transistor, and to provide a magnetic field current pulse through the magnetic field conductive line to generate a writing magnetic field pulse through the magnetic tunnel junction structure wherein at least a portion of the magnetic field current pulse is overlapping in time with respect to at least a portion of the writing current pulse.

30. A magnetic random access memory device according to claim 29 wherein at least a portion of the writing current pulse is non-overlapping in time with respect to at least a portion of the magnetic field current pulse and/or at least a portion of the magnetic field current pulse is non-overlapping in time with respect to at least a portion of the writing current pulse.

31. A magnetic random access memory device according to claim 29 wherein the controller is configured to initiate the writing current pulse before initiating the magnetic field current pulse and or to terminate the magnetic field current pulse before terminating the writing current pulse.

32. A magnetic random access memory device according to claim 29 wherein the controller is configured to initiate the writing current pulse before initiating the magnetic field current pulse and to terminate the magnetic field current pulse before terminating the writing current pulse.

33. A magnetic random access memory device according to claim 29 wherein the magnetic tunnel junction structure includes a magnetic resistor, wherein the controller is configured to provide the writing current pulse in a first direction through the magnetic tunnel junction structure to program a relatively high resistance for the magnetic resistor, and wherein the controller is configured to provide the writing current pulse in a second direction through the magnetic tunnel junction structure to program a relatively low resistance for the magnetic resistor.

34. A magnetic random access memory device according to claim 29 wherein the memory cell access transistor is coupled between the magnetic tunnel junction structure and a common source line, and wherein the controller is configured to provide the writing current pulse by turning on the memory cell access transistor and providing a voltage difference between the bit line and the common source line.

35. A magnetic random access memory device according to claim 29 wherein the bit line is between the magnetic field conductive line and the magnetic tunnel junction structure.

36. A magnetic random access memory device according to claim 29 wherein the magnetic tunnel junction structure has a length parallel with respect to a surface of the substrate, wherein the magnetic tunnel junction structure has a width parallel with respect to the surface of the substrate and perpendicular with respect to the length, wherein the length is greater than the width, and wherein the magnetic field conductive line is parallel with respect to the length of the magnetic tunnel junction structure.

37. A magnetic random access memory device according to claim 36 wherein the magnetic field conductive line and the length of the magnetic tunnel junction structure are parallel with respect to the bit line.

38. A magnetic random access memory device according to claim 36 wherein the magnetic field conductive line and the length of the magnetic tunnel junction structure are perpendicular with respect to the bit line.

39. A magnetic random access memory device according to claim 29 wherein the magnetic tunnel junction structure includes a magnetic resistor having a pinned ferromagnetic layer, a free ferromagnetic layer, and a tunnel insulating layer between the pinned and free ferromagnetic layers.

40. A magnetic random access memory device according to claim 39 wherein at least one of the pinned ferromagnetic layer and/or the free ferromagnetic layer comprises a synthetic anti-ferromagnetic layer.

41. A magnetic random access memory device according to claim 29 wherein the controller is further configured to provide a read signal across the magnetic tunnel junction structure after providing the writing current pulse and the writing magnetic field pulse, and to determine a program status of the magnetic tunnel junction structure based on the read signal.

42. A magnetic random access memory device according to claim 41 wherein providing the read signal comprises generating a read voltage across the magnetic tunnel junction structure that is less than a write voltage generated across the magnetic tunnel junction structure when providing the writing current pulse.

* * * * *

UNITED STATES PATENT AND TRADEMARK OFFICE
CERTIFICATE OF CORRECTION

| | | |
|---|---|---|
| PATENT NO. | : 7,164,598 B2 | Page 1 of 1 |
| APPLICATION NO. | : 11/201495 | |
| DATED | : January 16, 2007 | |
| INVENTOR(S) | : Won-Cheol Jeong et al. | |

It is certified that error appears in the above-identified patent and that said Letters Patent is hereby corrected as shown below:

<u>Column 22</u>

Line 20, Correct "j unction" to read --junction--.

Signed and Sealed this

Twenty-seventh Day of March, 2007

JON W. DUDAS
*Director of the United States Patent and Trademark Office*